(12) United States Patent
Lee et al.

(10) Patent No.: US 12,610,578 B2
(45) Date of Patent: *Apr. 21, 2026

(54) WORK FUNCTION CONTROL IN GATE STRUCTURES

(71) Applicant: Taiwan Semiconductor Manufacturing Company, Ltd., Hsinchu (TW)

(72) Inventors: Hsin-Yi Lee, Hsinchu (TW); Cheng-Lung Hung, Hsinchu City (TW); Ji-Cheng Chen, Hsinchu City (TW); Weng Chang, Hsin-Chu (TW); Chi On Chui, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/754,507

(22) Filed: Jun. 26, 2024

(65) Prior Publication Data

US 2024/0347636 A1     Oct. 17, 2024

Related U.S. Application Data

(63) Continuation of application No. 17/875,561, filed on Jul. 28, 2022, now Pat. No. 12,132,112, which is a
(Continued)

(51) Int. Cl.
*H10D 30/62* (2025.01)
*H10D 30/01* (2025.01)

(52) U.S. Cl.
CPC ........... *H10D 30/62* (2025.01); *H10D 30/024* (2025.01); *H10D 30/6219* (2025.01)

(58) Field of Classification Search
None
See application file for complete search history.

(56) References Cited

U.S. PATENT DOCUMENTS

| | | |
|---|---|---|
| 7,821,083 B2 | 10/2010 | Wang et al. |
| 9,093,530 B2 | 7/2015 | Huang et al. |

(Continued)

FOREIGN PATENT DOCUMENTS

| | | |
|---|---|---|
| CN | 101281933 A | 10/2008 |
| CN | 103262246 A | 8/2013 |

(Continued)

*Primary Examiner* — Sue A Purvis
*Assistant Examiner* — Jordan M Klein
(74) *Attorney, Agent, or Firm* — Sterne, Kessler, Goldstein & Fox P.L.L.C.

(57) ABSTRACT

A semiconductor device with different gate structure configurations and a method of fabricating the same are disclosed. The semiconductor device includes a fin structure disposed on a substrate, a nanostructured channel region disposed on the fin structure, and a gate-all-around (GAA) structure surrounding the nanostructured channel region. The GAA structure includes a high-K (HK) gate dielectric layer with a metal doped region having dopants of a first metallic material, a p-type work function metal (pWFM) layer disposed on the HK gate dielectric layer, a bimetallic nitride layer interposed between the HK gate dielectric layer and the pWFM layer, an n-type work function metal (nWFM) layer disposed on the pWFM layer, and a gate metal fill layer disposed on the nWFM layer. The pWFM layer includes a second metallic material and the bimetallic nitride layer includes the first and second metallic materials.

20 Claims, 20 Drawing Sheets

Related U.S. Application Data continuation of application No. 16/887,203, filed on May 29, 2020, now Pat. No. 11,444,198.

(56) References Cited

U.S. PATENT DOCUMENTS

| | | | |
|---|---|---|---|
| 9,171,929 B2 | 10/2015 | Lee et al. | |
| 9,214,555 B2 | 12/2015 | Oxland et al. | |
| 9,236,267 B2 | 1/2016 | De et al. | |
| 9,362,282 B1 | 6/2016 | Ando et al. | |
| 9,520,482 B1 | 12/2016 | Chang et al. | |
| 9,548,303 B2 | 1/2017 | Lee et al. | |
| 9,564,489 B2 | 2/2017 | Yeo et al. | |
| 9,576,814 B2 | 2/2017 | Wu et al. | |
| 9,601,342 B2 | 3/2017 | Lee et al. | |
| 9,608,116 B2 | 3/2017 | Ching et al. | |
| 10,461,167 B2 | 10/2019 | Lee et al. | |
| 10,516,034 B2 | 12/2019 | Wang et al. | |
| 10,573,521 B2 | 2/2020 | Wang et al. | |
| 10,700,064 B1 | 6/2020 | Zhang et al. | |
| 11,444,198 B2 * | 9/2022 | Lee | H10D 30/6757 |
| 12,132,112 B2 * | 10/2024 | Lee | H10D 30/43 |
| 2009/0267053 A1 | 10/2009 | Peng et al. | |
| 2010/0052066 A1 | 3/2010 | Yu et al. | |
| 2011/0127618 A1 | 6/2011 | Scheiper et al. | |
| 2012/0138953 A1 | 6/2012 | Cai et al. | |
| 2013/0119487 A1 | 5/2013 | Lin, Jr. et al. | |
| 2013/0240996 A1 | 9/2013 | Yin et al. | |
| 2015/0255267 A1 | 9/2015 | Tapily et al. | |
| 2016/0225868 A1 * | 8/2016 | Kim | H10D 84/0158 |
| 2016/0322473 A1 | 11/2016 | JangJian et al. | |
| 2017/0110550 A1 | 4/2017 | Tsai et al. | |
| 2017/0207218 A1 | 7/2017 | Chang et al. | |
| 2018/0315667 A1 | 11/2018 | Kwon et al. | |
| 2018/0374926 A1 | 12/2018 | Lee et al. | |
| 2019/0057863 A1 | 2/2019 | Yang et al. | |
| 2019/0067117 A1 | 2/2019 | Chen et al. | |
| 2019/0097023 A1 | 3/2019 | Wu et al. | |
| 2019/0131418 A1 | 5/2019 | Ando et al. | |
| 2019/0198498 A1 * | 6/2019 | Park | H10D 30/6757 |
| 2019/0371675 A1 * | 12/2019 | Tsai | H10D 84/0158 |
| 2020/0035678 A1 | 1/2020 | Lee et al. | |
| 2020/0043808 A1 | 2/2020 | Bao et al. | |
| 2020/0090940 A1 | 3/2020 | Huang et al. | |
| 2020/0135879 A1 | 4/2020 | Cheng et al. | |
| 2020/0411387 A1 * | 12/2020 | Chiang | H10D 30/6735 |
| 2021/0082706 A1 * | 3/2021 | Yu | H10D 30/024 |
| 2021/0118995 A1 | 4/2021 | Cheng et al. | |
| 2021/0134951 A1 | 5/2021 | Chen et al. | |
| 2021/0217870 A1 | 7/2021 | Lee et al. | |
| 2023/0015761 A1 | 1/2023 | Lee et al. | |

FOREIGN PATENT DOCUMENTS

| | | |
|---|---|---|
| CN | 106981488 A | 7/2017 |
| CN | 107017290 A | 8/2017 |
| DE | 102009047304 A1 | 6/2011 |
| KR | 20080110522 A | 12/2008 |
| KR | 20160129666 A | 11/2016 |
| KR | 20180060944 A | 6/2018 |
| KR | 20190000965 A | 1/2019 |
| WO | WO-2013134898 A1 | 9/2013 |

* cited by examiner

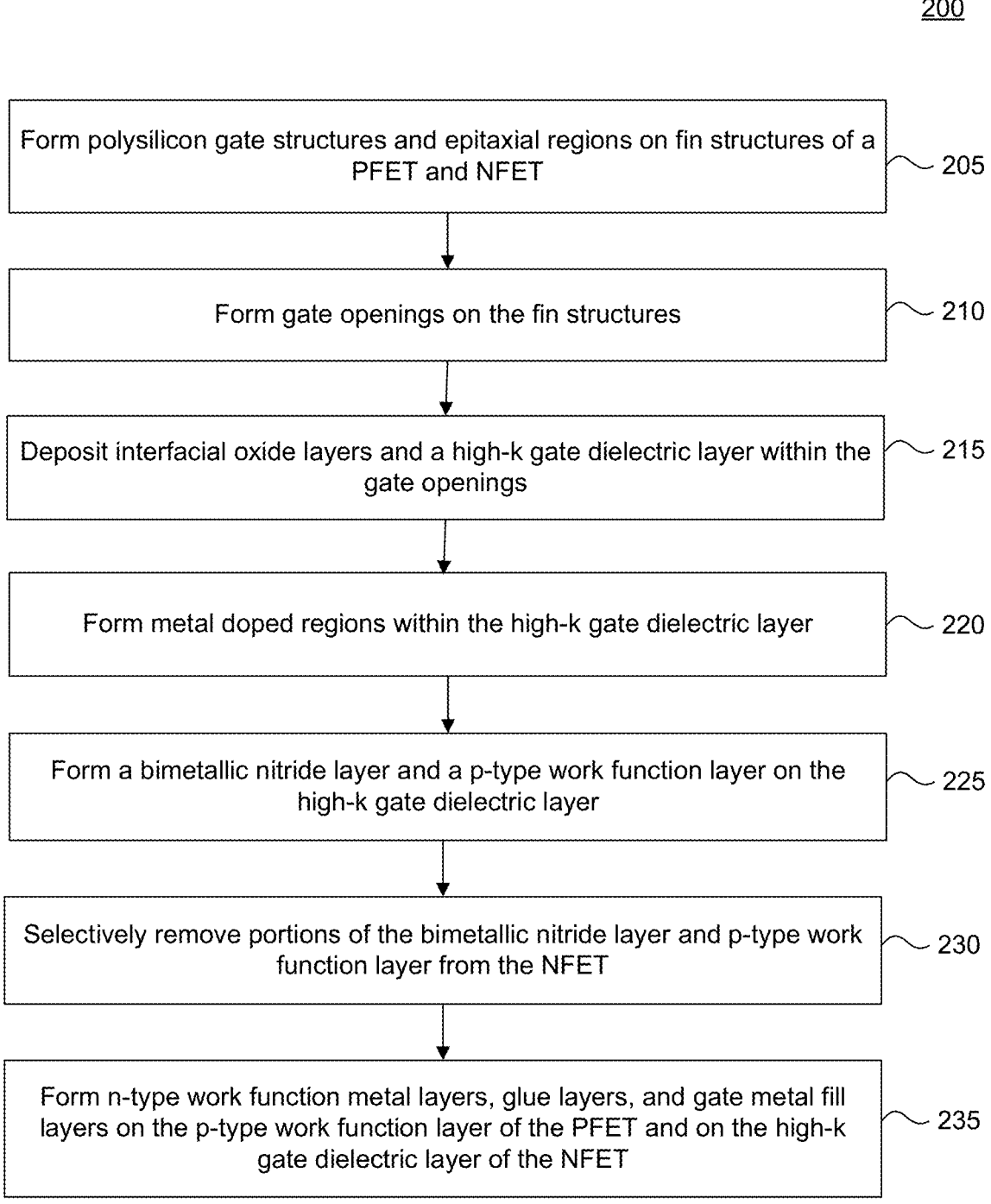

200

Form polysilicon gate structures and epitaxial regions on fin structures of a PFET and NFET ⌐∿ 205

Form gate openings on the fin structures ⌐∿ 210

Deposit interfacial oxide layers and a high-k gate dielectric layer within the gate openings ⌐∿ 215

Form metal doped regions within the high-k gate dielectric layer ⌐∿ 220

Form a bimetallic nitride layer and a p-type work function layer on the high-k gate dielectric layer ⌐∿ 225

Selectively remove portions of the bimetallic nitride layer and p-type work function layer from the NFET ⌐∿ 230

Form n-type work function metal layers, glue layers, and gate metal fill layers on the p-type work function layer of the PFET and on the high-k gate dielectric layer of the NFET ⌐∿ 235

Fig. 2

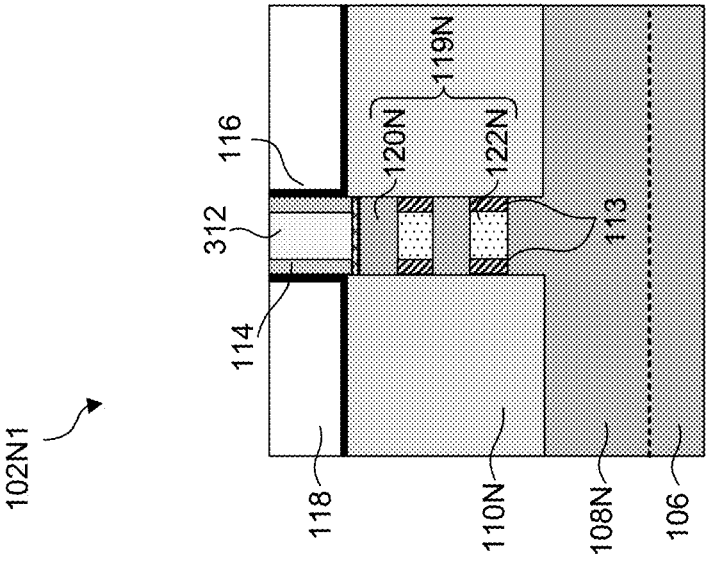
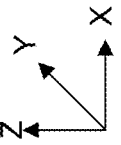
Fig. 3B
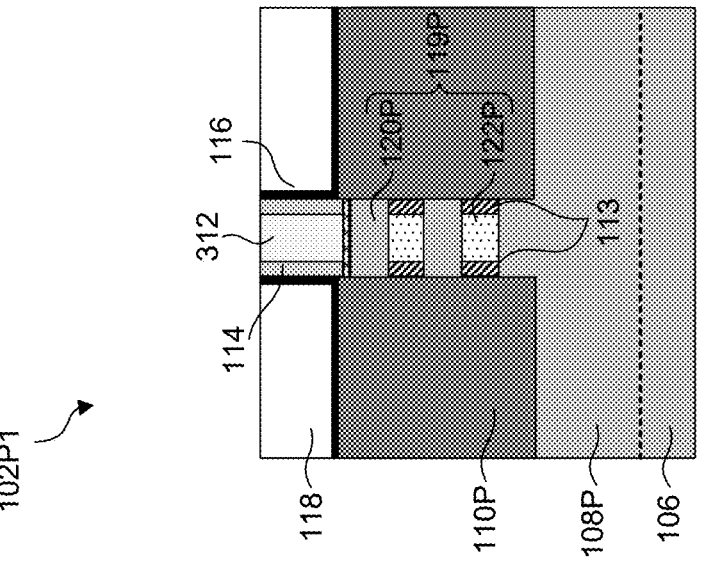
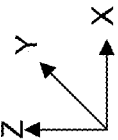
Fig. 3A

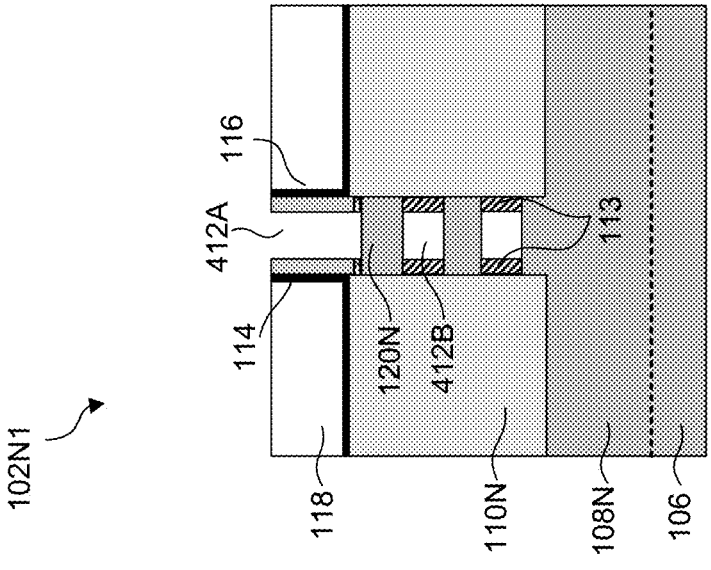
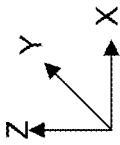
Fig. 4B
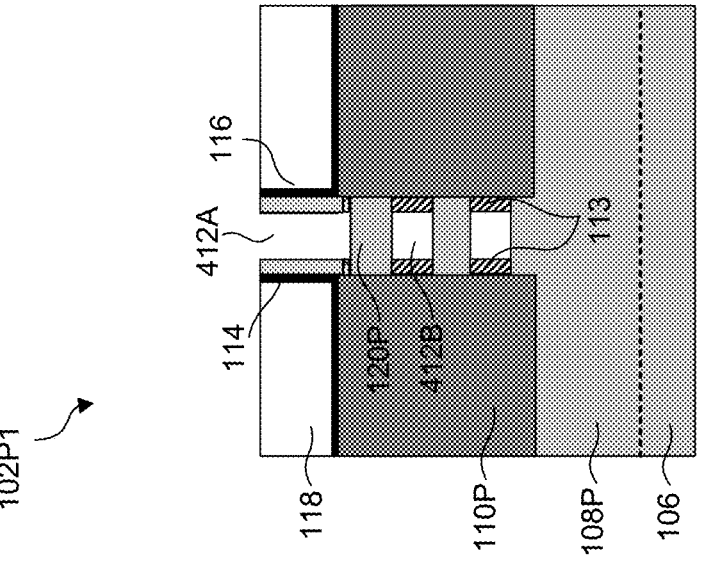
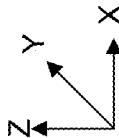
Fig. 4A

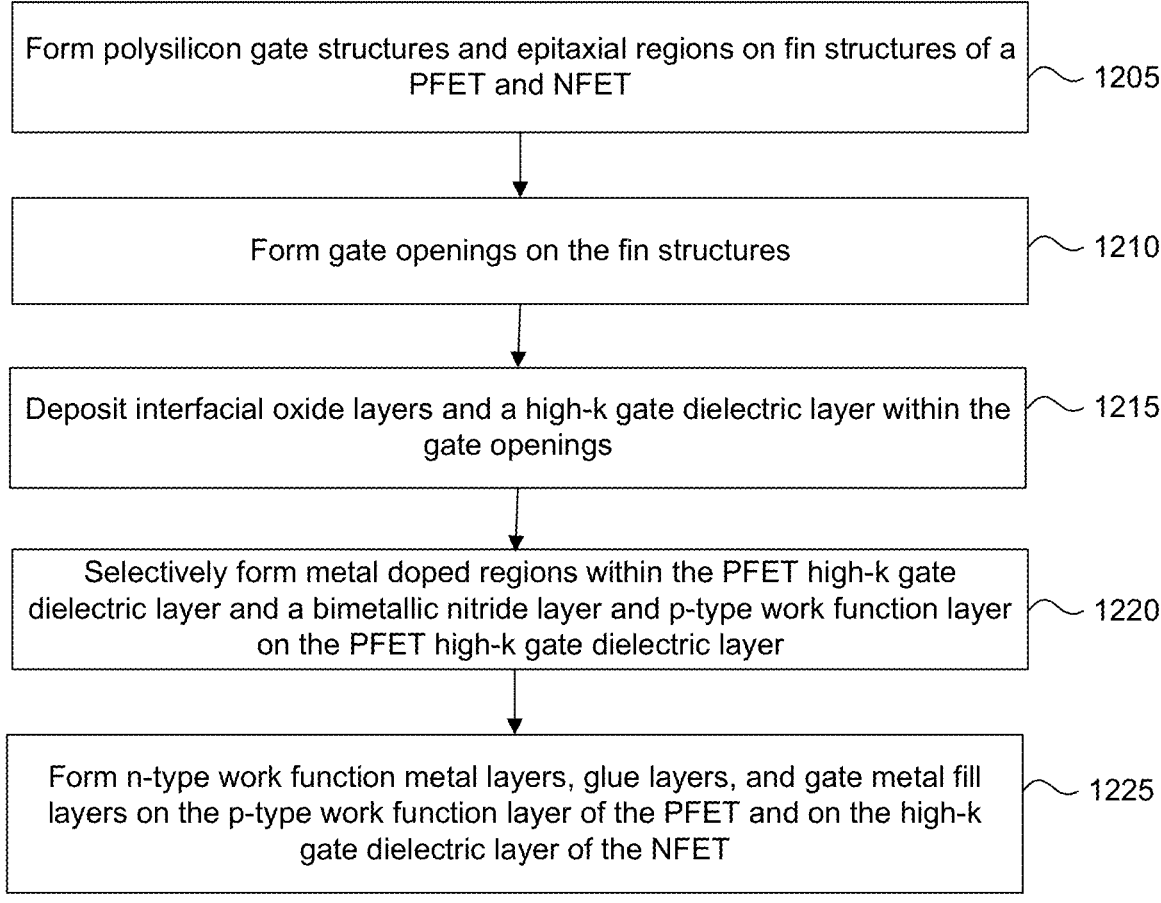

1200

Form polysilicon gate structures and epitaxial regions on fin structures of a PFET and NFET                              ~ 1205

Form gate openings on the fin structures                              ~ 1210

Deposit interfacial oxide layers and a high-k gate dielectric layer within the gate openings                              ~ 1215

Selectively form metal doped regions within the PFET high-k gate dielectric layer and a bimetallic nitride layer and p-type work function layer on the PFET high-k gate dielectric layer                              ~ 1220

Form n-type work function metal layers, glue layers, and gate metal fill layers on the p-type work function layer of the PFET and on the high-k gate dielectric layer of the NFET                              ~ 1225

Fig. 12

WORK FUNCTION CONTROL IN GATE STRUCTURES

CROSS-REFERENCE TO RELATED APPLICATIONS

This application is a continuation of U.S. patent application Ser. No. 17/875,561, titled "Work Function Control in Gate Structures," filed Jul. 28, 2022, which is a continuation of U.S. patent application Ser. No. 16/887,203, titled "Work Function Control in Gate Structures," filed May 29, 2020, each of which is incorporated by reference herein in its entirety.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and fin field effect transistors (finFETs). Such scaling down has increased the complexity of semiconductor manufacturing processes.

BRIEF DESCRIPTION OF THE DRAWINGS

Aspects of this disclosure are best understood from the following detailed description when read with the accompanying figures.

FIG. 2 is a flow diagram of a method for fabricating a semiconductor device with different gate structures, in accordance with some embodiments.

FIGS. 3A-11B illustrate cross-sectional views of a semiconductor device with different gate structures at various stages of its fabrication process, in accordance with some embodiments.

FIG. 12 is a flow diagram of a method for fabricating a semiconductor device with different gate structures, in accordance with some embodiments.

FIGS. 13A-17B illustrate cross-sectional views of a semiconductor device with different gate structures at various stages of its fabrication process, in accordance with some embodiments.

Illustrative embodiments will now be described with reference to the accompanying drawings. In the drawings, like reference numerals generally indicate identical, functionally similar, and/or structurally similar elements.

DETAILED DESCRIPTION

Figure 1A:
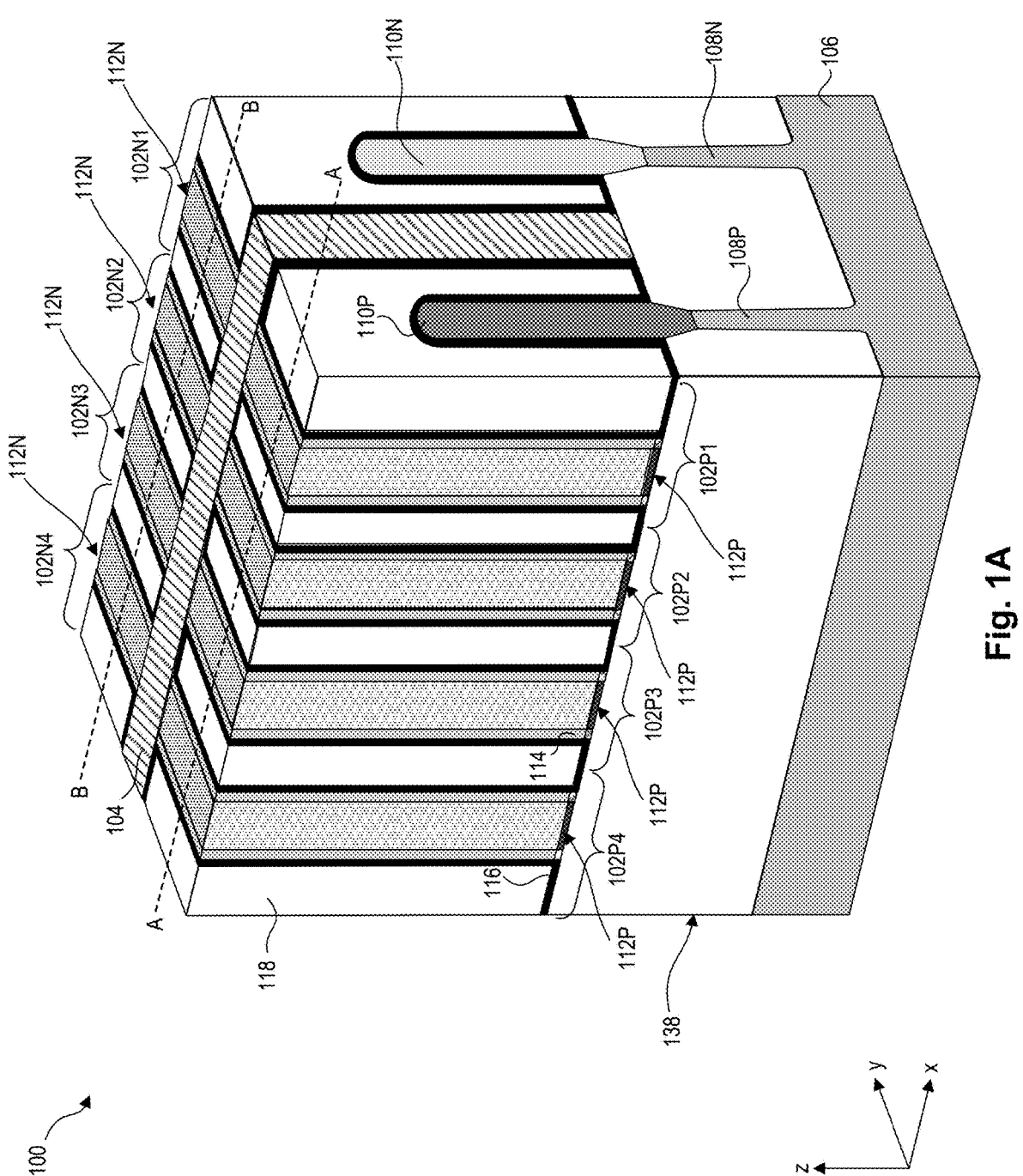
FIGS. 1A, 1B-1C, and 1D-1G illustrate an isometric view, cross-sectional views, and device characteristics of a semiconductor device with different gate structures, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the process for forming a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

As used herein, the term "high-k" refers to a high dielectric constant. In the field of semiconductor device structures and manufacturing processes, high-k refers to a dielectric constant that is greater than the dielectric constant of $SiO_2$ (e.g., greater than 3.9).

As used herein, the term "low-k" refers to a low dielectric constant. In the field of semiconductor device structures and manufacturing processes, low-k refers to a dielectric constant that is less than the dielectric constant of $SiO_2$ (e.g., less than 3.9).

As used herein, the term "p-type" defines a structure, layer, and/or region as being doped with p-type dopants, such as boron.

As used herein, the term "n-type" defines a structure, layer, and/or region as being doped with n-type dopants, such as phosphorus.

As used herein, the term "nanostructured" defines a structure, layer, and/or region as having a horizontal dimension (e.g., along an X- and/or Y-axis) and/or a vertical dimension (e.g., along a Z-axis) less than, for example, 100 nm.

As used herein, the term "n-type work function metal (nWFM)" defines a metal or a metal-containing material with a work function value closer to a conduction band energy than a valence band energy of a material of a FET channel region. In some embodiments, the term "n-type work function metal (nWFM)" defines a metal or a metal-containing material with a work function value less than 4.5 eV.

As used herein, the term "p-type work function metal (pWFM)" defines a metal or a metal-containing material with a work function value closer to a valence band energy than a conduction band energy of a material of a FET channel region. In some embodiments, the term "p-type work function metal (pWFM)" defines a metal or a metal-containing material with a work function value equal to or greater than 4.5 eV.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

As used herein, the term "multi-threshold voltage (multi-Vt) device" defines a semiconductor device with two or more FETs, where each of the two or more FETs have a threshold voltage different from each other.

The fin structures disclosed herein may be patterned by any suitable method. For example, the fin structures may be patterned using one or more photolithography processes, including double-patterning or multi-patterning processes. Double-patterning or multi-patterning processes can combine photolithography and self-aligned processes, allowing patterns to be created that have, for example, pitches smaller than what is otherwise obtainable using a single, direct photolithography process. For example, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

The required gate voltage—the threshold voltage (Vt)—to turn on a field effect transistor (FET) can depend on the semiconductor material of the FET channel region and/or the effective work function (EWF) value of a gate structure of the FET. For example, for an n-type FET (NFET), reducing the difference between the EWF value(s) of the NFET gate structure and the conduction band energy of the material (e.g., 4.1 eV for Si or 3.8 eV for SiGe) of the NFET channel region can reduce the NFET threshold voltage. For a p-type FET (PFET), reducing the difference between the EWF value(s) of the PFET gate structure and the valence band energy of the material (e.g., 5.2 eV for Si or 4.8 eV for SiGe) of the PFET channel region can reduce the PFET threshold voltage. The EWF values of the FET gate structures can depend on the thickness and/or material composition of each of the layers of the FET gate structure. Accordingly, FETs can be manufactured with different threshold voltages by adjusting the thickness and/or material composition of the FET gate structures.

Due to the increasing demand for multi-functional portable devices, there is an increasing demand for FETs with different threshold voltages on the same substrate. One way to achieve such multi-Vt device can be with different work function metal (WFM) layer thicknesses in the FET gate structures. However, the different WFM layer thicknesses can be constrained by the FET gate structure geometries. For example, in gate-all-around (GAA) FETs, the WFM layer thicknesses can be constrained by the spacing between the nanostructured channel regions of the GAA FETs. Also, depositing different WFM layer thicknesses can become increasingly challenging with the continuous scaling down of FETs (e.g., GAA FETs and/or finFETs).

The present disclosure provides example multi-Vt devices with FETs (e.g., GAA FETs) having threshold voltages different from each other and provides example methods of forming such FETs on the same substrate. The example methods form PFETs with WFM layer of similar material and thickness, but with different threshold voltages on the same substrate. These example methods can be more cost-effective (e.g., cost reduced by about 20% to about 30%) and time-efficient (e.g., time reduced by about 15% to about 20%) in manufacturing reliable FET gate structures with different threshold voltages than other methods of forming FETs with similar channel dimensions and threshold voltages on the same substrate. In addition, these example methods can form FET gate structures with much smaller dimensions (e.g., thinner gate stacks) than other methods of forming FETs with similar threshold voltages.

In some embodiments, PFETs with different gate structure configurations, but with similar WFM layer can be selectively formed on the same substrate to achieve threshold voltages different from each other. The different gate structures can have (i) metal doped regions of different metal concentrations within high-K (HK) gate dielectric layers and (ii) bimetallic nitride layers of different metal concentrations between HK gate dielectric layers and WFM layers. The different metal concentrations result in gate structures with different EWF values and threshold voltages. In some embodiments, varying metal concentrations within a range of about 2 atomic % to about 10 atomic % can induce about ±80 mV shifts in EWF values and about ±50 mV shifts in threshold voltages. Thus, tuning the metal concentrations within HK gate dielectric layers and between HK gate dielectric layers and WFM layers can tune the EWF values of the PFET gate structures and as a result, can adjust the threshold voltages of the PFETs without varying the material and/or thickness of the WFM layers.

Figures 1B, 1C:
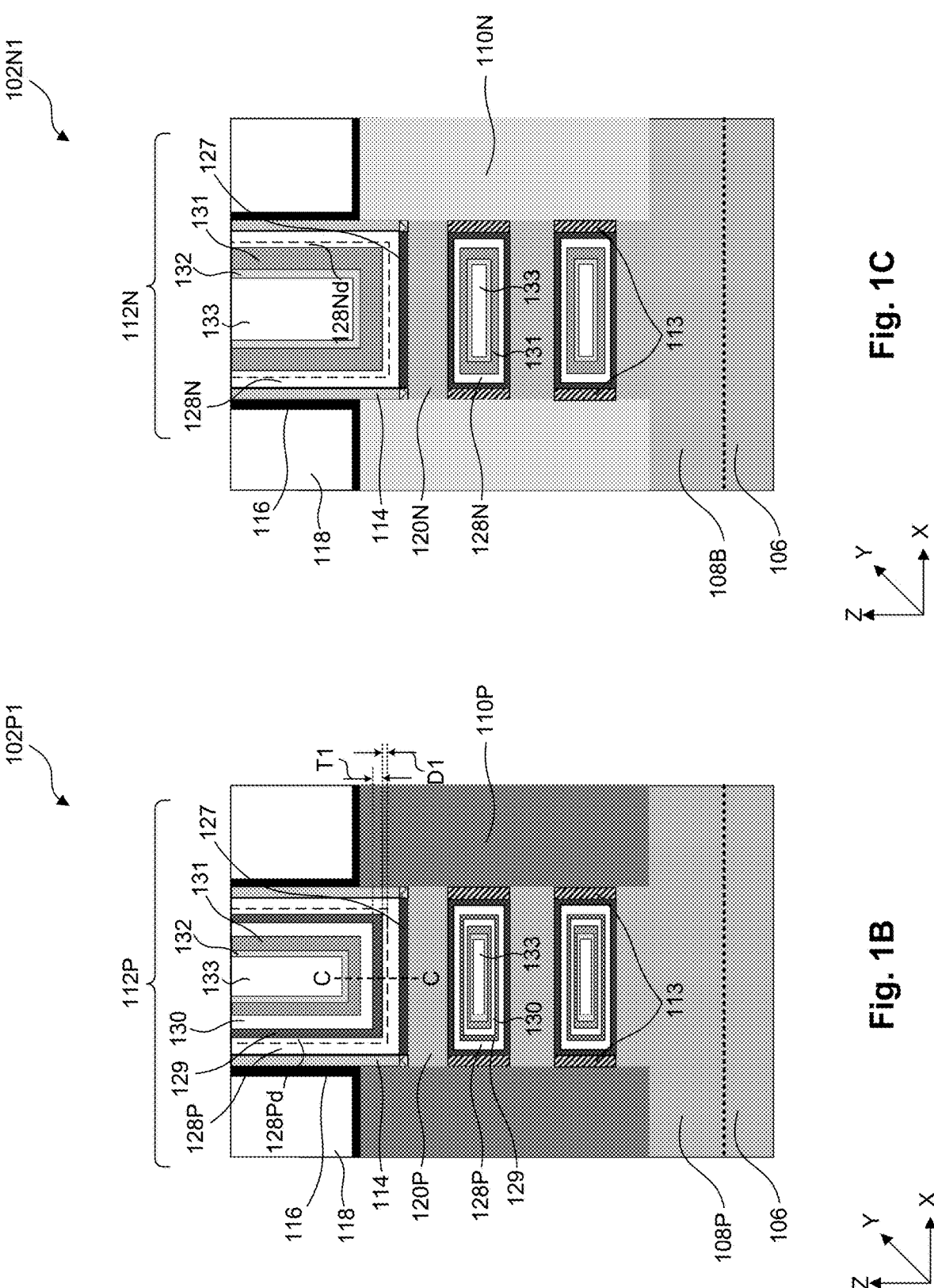
Figures 1D, 1E, 1F:
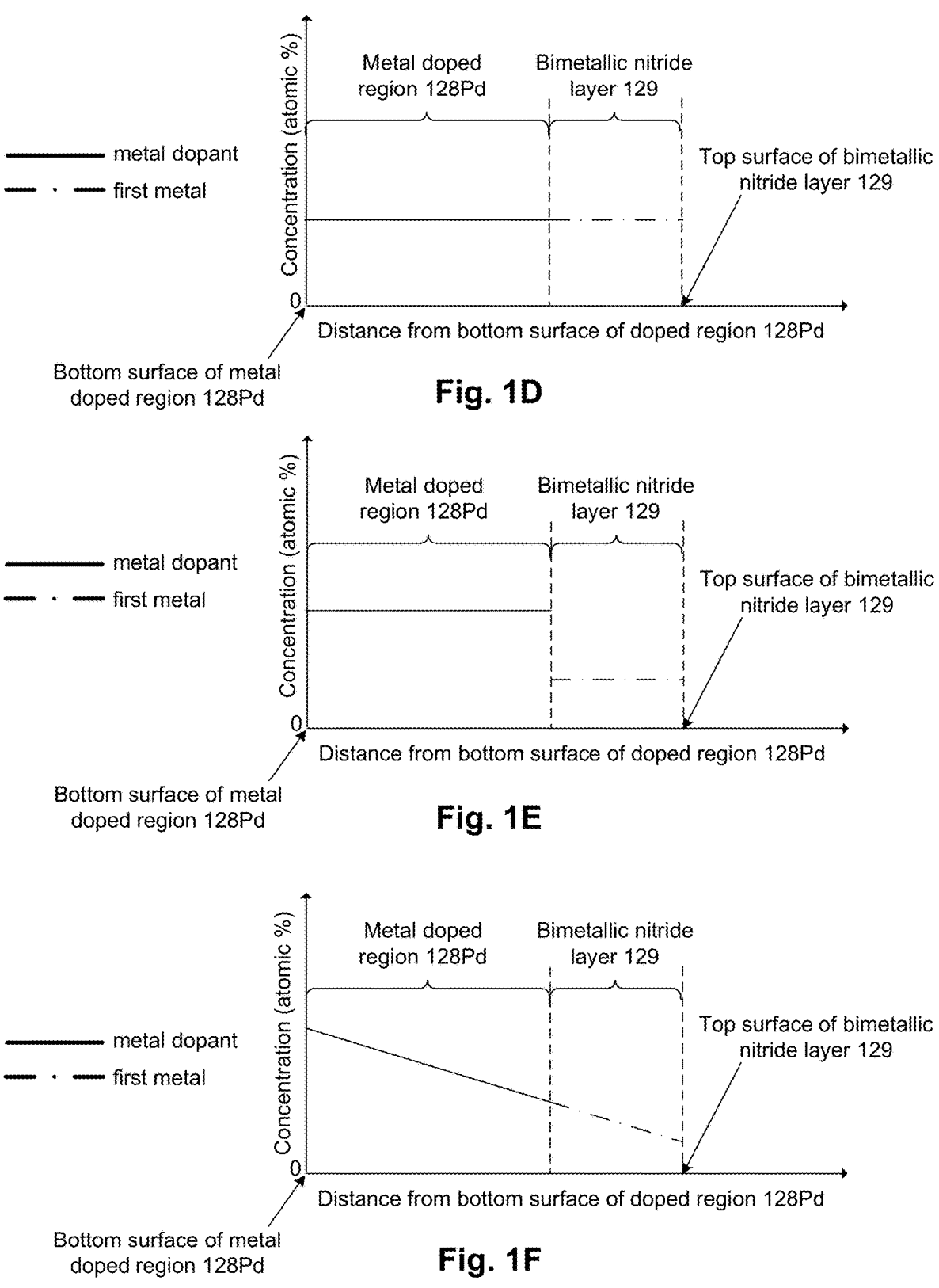
Figure 1G:
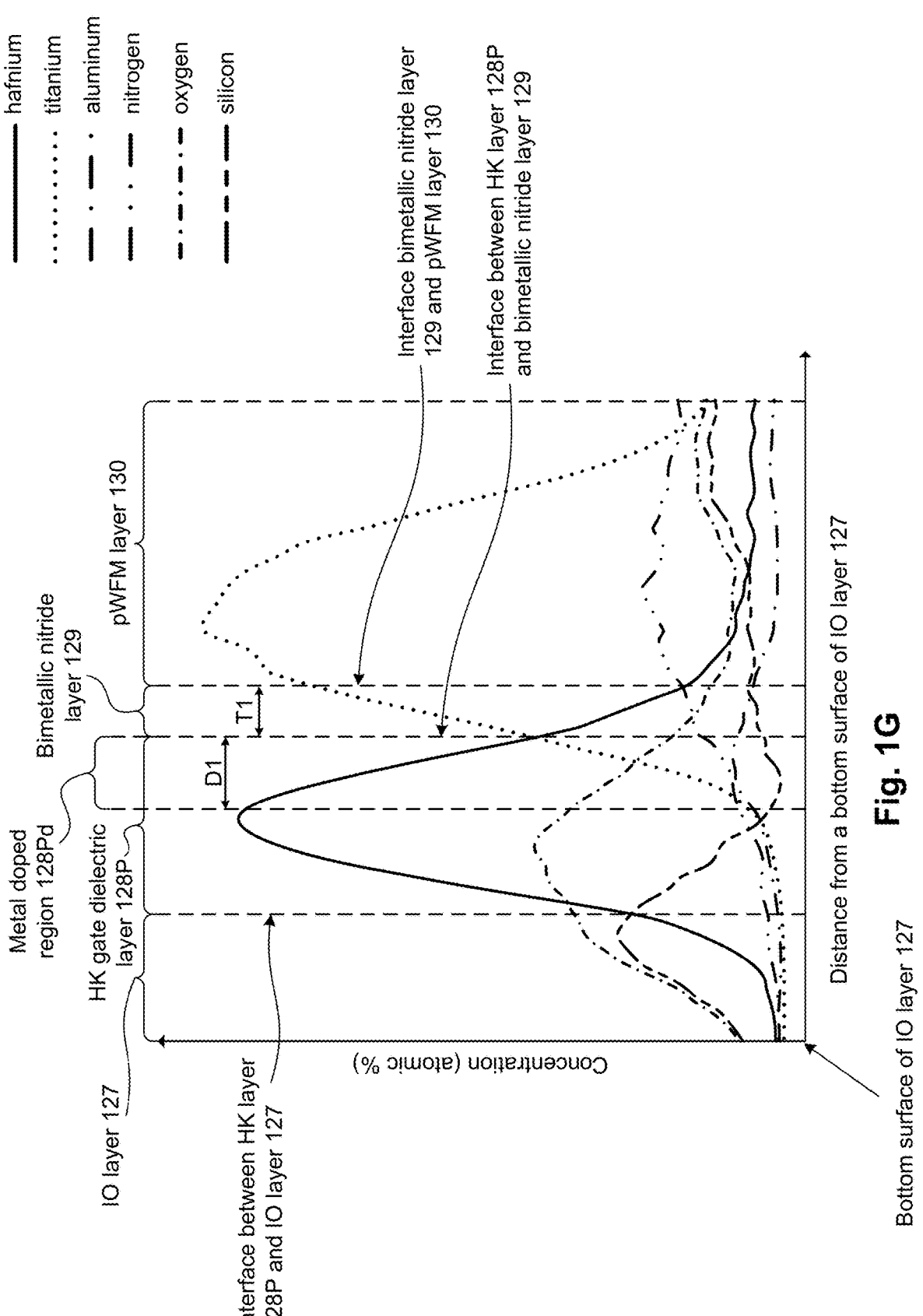

A semiconductor device 100 having PFETs 102P1-102P4 and NFETs 102N1-102N4 is described with reference to FIGS. 1A-1G, according to some embodiments. FIG. 1A illustrates an isometric view of semiconductor device 100, according to some embodiments. FIGS. 1B and 1C illustrate cross-sectional views along respective lines A-A and B-B of semiconductor device 100 of FIG. 1A, according to some embodiments. FIGS. 1E-1G illustrate devices characteristics of semiconductor device 100, according to some embodiments. The discussion of PFET 102P1 applies to 102P2-102P4 and the discussion of NFET 102N1 applies to NFETs 102N2-102N4, unless mentioned otherwise. The discussion of elements of PFETs 102P1-102P4 and NFETs 102N1-102N4 with the same annotations applies to each other, unless mentioned otherwise.

Referring to FIGS. 1A-1C, semiconductor device 100 can be formed on a substrate 106. Substrate 106 can be a semiconductor material, such as silicon, germanium (Ge), silicon germanium (SiGe), a silicon-on-insulator (SOI) structure, and a combination thereof. Further, substrate 106 can be doped with p-type dopants (e.g., boron, indium, aluminum, or gallium) or n-type dopants (e.g., phosphorus or arsenic).

PFET 102P1 and NFET 102N1 can include fin structures 108P-108N extending along an X-axis, epitaxial regions 110P-110N disposed on respective fin structures 108P-108N, nanostructured channel regions 120P-120N disposed between respective epitaxial regions 110P-110N, gate structures 112P-112N surrounding respective nanostructured channel regions 120P-120N, inner spacers 113, and gate spacers 114.

In some embodiments, fin structures 108P-108N can include a material similar to substrate 106. Nanostructured channel regions 120P-120N can include semiconductor materials similar to or different from substrate 106 and can include semiconductor material similar to or different from each other. In some embodiments, nanostructured channel regions 120N can include Si, SiAs, silicon phosphide (SiP), SiC, or silicon carbon phosphide (SiCP) and nanostructured channel regions 120P can include SiGe, silicon germanium boron (SiGeB), germanium boron (GeB), silicon germanium stannum boron (SiGeSnB), or a III-V semiconductor compound. In some embodiments, nanostructured channel regions 120P-120N can both include Si, SiAs, SiP, SiC, SiCP, SiGe, SiGeB, GeB, SiGeSnB, or a III-V semiconductor compound. Though rectangular cross-sections of nanostructured channel regions 120P-120N are shown, nanostructured channel regions 120P-120N can have cross-sections of other geometric shapes (e.g., circular, elliptical, triangular, or polygonal).

Epitaxial regions 110P-110N can be grown on respective fin structures 108P-108N and can be source/drain (S/D) regions of PFET 102P1 and NFET 102N1. Epitaxial regions 110P-110N can include epitaxially-grown semiconductor materials similar to or different from each other. In some embodiments, the epitaxially-grown semiconductor material can include the same material or a different material from the material of substrate 106. Epitaxial regions 110P and 110N can be p- and n-type, respectively. In some embodiments, n-type epitaxial regions 110N can include SiAs, SiC, or SiCP. P-type epitaxial regions 110P can include SiGe, SiGeB, GeB, SiGeSnB, a III-V semiconductor compound, or a combination thereof.

Gate structures 112P-112N can be multi-layered structures. Gate structures 112P-112N can be wrapped around respective nanostructured channel regions 120P-120N for which gate structures 112P-112N can be referred to as "gate-all-around (GAA) structures" or "horizontal gate-all-around (HGAA) structures." PFET 102P1 and NFET 102N1 can be referred to as "GAA PFET 102P1 and NFET 102N1." In some embodiments, PFET 102P1 and NFET 102N1 can be finFETs and have fin regions (not shown) instead of nanostructures channel regions 120P-120N. Such finFETs 120P1-120N1 can have respective gate structures 112P-112N disposed on fin regions.

Gate structures 112P-112N can include (i) interfacial oxide (IO) layers 127, (ii) HK gate dielectric layers 128P-128N, (iii) metal doped regions 128Pd-128Nd, (iv) n-type WFM ("nWFM) layers 131, (vii) glue layers 132, and (viii) gate metal fill layers 133. Gate structure 112P can further include bimetallic nitride layer 129 and p-type WFM ("pWFM") layer 130. Though FIGS. 1B-1C show that all the layers of gate structure 112P are wrapped around nanostructured channel regions 120P, nanostructured channel regions 120P can be wrapped around by at least IO layers 127 and HK gate dielectric layers 128P to fill the spaces between adjacent nanostructured channel regions 120P. Accordingly, nanostructured channel regions 120P can be electrically isolated from each other to prevent shorting between gate structure 112P and S/D regions 110P during operation of PFET 102P1. Similarly, nanostructured channel regions 120N can be wrapped around by at least IO layers 127 and HK gate dielectric layers 128N to electrically isolated nanostructured channel regions 120N from each other to prevent shorting between gate structure 112N and S/D regions 110N during operation of NFET 102N1.

IO layers 127 can be disposed on nanostructured channel regions 120P-120N. In some embodiments, IO layers 127 can include silicon oxide ($SiO_2$), silicon germanium oxide ($SiGeO_x$) or germanium oxide ($GeO_x$) and a thickness ranging from about 0.5 nm to about 1.5 nm.

HK gate dielectric layers 128P-128N can be disposed on IO layers 127. Each of HK gate dielectric layers 128P-128N can have a thickness (e.g., about 1 nm to about 3 nm) that is about 2 to 3 times the thickness of IO layers 127 and can include (i) a high-k dielectric material, such as hafnium oxide ($HfO_2$), titanium oxide ($TiO_2$), hafnium zirconium oxide (HfZrO), tantalum oxide ($Ta_2O_3$), hafnium silicate ($HfSiO_4$), zirconium oxide ($ZrO_2$), and zirconium silicate ($ZrSiO_2$) and (ii) a high-k dielectric material having oxides of lithium (Li), beryllium (Be), magnesium (Mg), calcium (Ca), strontium (Sr), scandium (Sc), yttrium (Y), zirconium (Zr), aluminum (Al), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), lutetium (Lu), or (iii) a combination thereof.

Figures 17A, 17B:
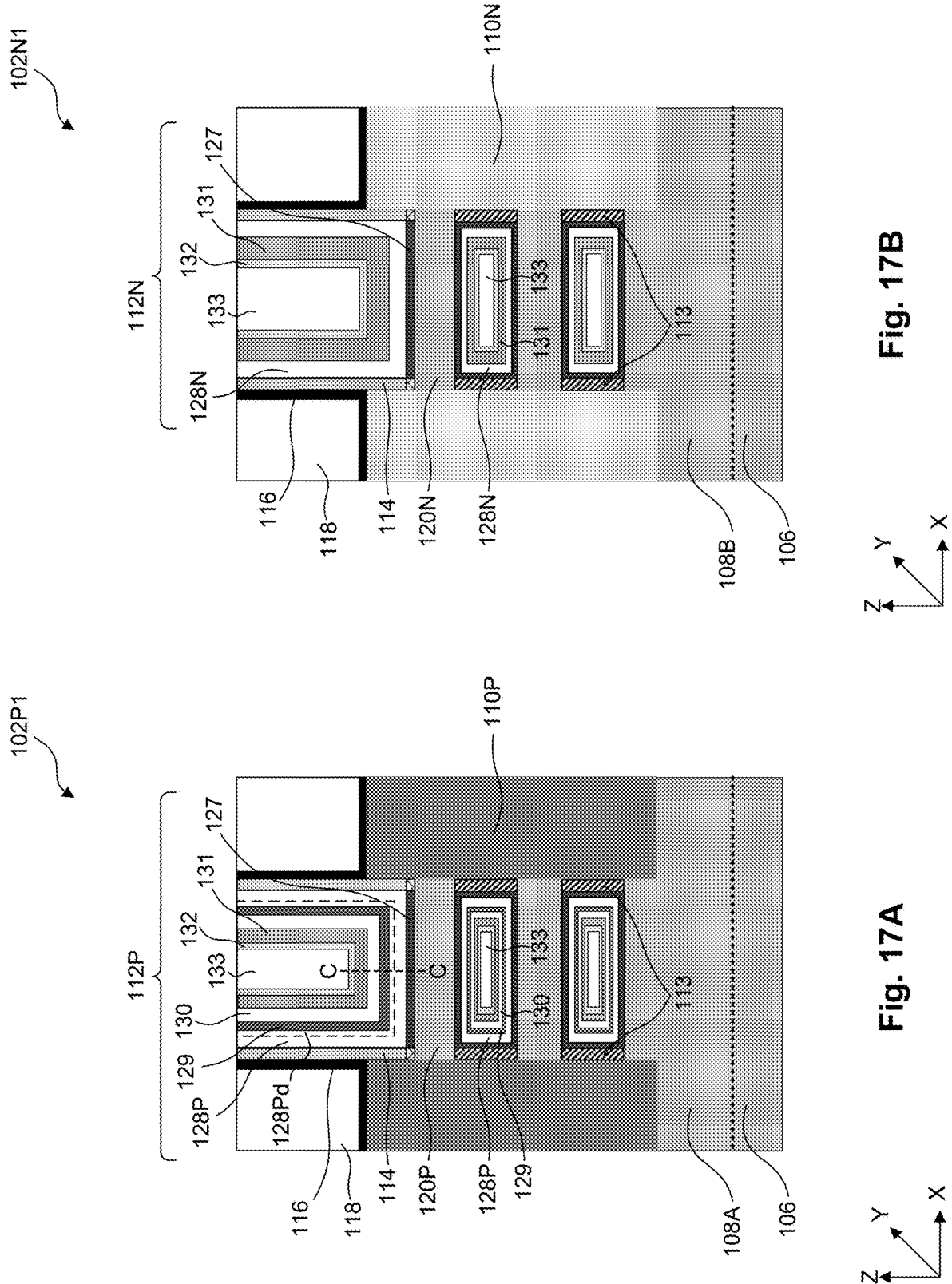

HK gate dielectric layers 128P-128N can include respective metal doped regions 128Pd-128Nd. In some embodiments, metal doped regions 128Pd-128Nd can include dopants of (i) a metal from group IIA (e.g., magnesium (Mg) or strontium (Sr)), group IIIA (e.g., aluminum (Al)), group IIIB (e.g., yttrium (Y)), or group IVB (e.g., zirconium (Zr)) of the periodic table; (ii) a rare-earth metal, such as Lanthanum (La), Yttrium (Y), Scandium (Sc), Cerium (Ce), Ytterbium (Yb), Erbium (Er), Dysprosium (Dy) and Lutetium (Lu); or (iii) a combination thereof. In some embodiments, metal doped regions 128Pd-128Nd can include Al dopants or La dopants. In some embodiments, metal doped region 128Nd may not be present in HK gate dielectric layer 128N (shown in FIG. 17B) as a result of the fabrication process (e.g., method 1200) used to form PFET 102P1 and NFET 102N1, as described in further detail below.

Bimetallic nitride layer 129 can be disposed on HK gate dielectric layer 128P. In some embodiments, bimetallic nitride layer 129 can include (i) a first metal that is same as the dopant material included in metal doped region 128Pd, and (ii) a second metal that is same as a metal included in pWFM layer 130. In some embodiments, pWFM layer 130 can include a metallic material with a work function value closer to a valence band-edge energy than a conduction band-edge energy of a material of nanostructured channel regions 120P. For example, pWFM layer 130 can include a substantially Al-free (e.g., with no Al) metallic material with a work function value equal to or greater than 4.5 eV (e.g., about 4.5 eV to about 5.5 eV), which can be closer to the valence band-edge energy (e.g., 5.2 eV of Si) than the conduction band-edge energy (e.g., 4.1 eV of Si) of nanostructured channel regions 120P.

In some embodiments, pWFM layer 130 can include (i) substantially Al-free (e.g., with no Al) Ti-based nitrides or alloys, such as titanium nitride (TiN), titanium silicon nitride (TiSiN), titanium gold (Ti—Au) alloy, titanium copper (Ti—Cu) alloy, titanium chromium (Ti—Cr) alloy, titanium cobalt (Ti—Co) alloy, titanium molybdenum (Ti—Mo) alloy, and titanium nickel (Ti—Ni) alloy; (ii) substantially Al-free (e.g., with no Al) Ta-based nitrides or alloys, such as tantalum nitride (TaN), tantalum silicon nitride (TaSiN), tantalum gold (Ta—Au) alloy, tantalum copper (Ta—Cu) alloy, tantalum tungsten (Ta—W) alloy, tantalum platinum (Ta—Pt) alloy, tantalum molybdenum (Ta—Mo) alloy, and tantalum nickel (Ta—Ni) alloy; or (iii) a combination thereof. In some embodiments, pWFM layer 130 can include a thickness ranging from about 1 nm to about 3 nm. The thickness within this range can allow pWFM layer 130 to be wrapped around nanostructured channel regions 120P without being constrained by the spacing between adjacent nanostructured channel regions 120P.

The work function value of pWFM layer 130 can induce an EWF value to gate structure 112P of PFET 102P1. This EWF value of gate structure 112P can be adjusted, without varying the thickness of pWFM layer 130, by controlling the concentration of metal dopants in metal doped region 128Pd and/or the concentration of the first metal in bimetallic nitride layer 129. In addition, by controlling the concentrations of metal dopants and/or the first metal, PFETs 102P1-102P4 with similar pWFM layer 130 can be configured to have gate structures 112P with EWF values different from each other. Since EWF values of gate structures correspond to threshold voltage of FETs, gate structures 112P with different EWF values result in PFETs 102P1-102P4 with different threshold voltages on the same substrate 106.

In some embodiments, the EWF value of gate structure 112P can be adjusted within a range of about ±80 mV by controlling the concentrations of metal dopants and/or the first metal. Adjusting the EWF value within the range of about ±80 mV can adjust the threshold value of gate structure 112P within a range of about ±50 mV. Such adjustment ranges can be achieved with a concentration of the first metal (e.g., Al) ranging from about 2 atomic % to about 10 atomic % in bimetallic nitride layer 129 and/or a concentration ratio of the metal dopants (e.g., Al dopant) to a metallic material ("HK metal"; e.g., Hf) of HK gate dielectric layer 128P ranging from about 0.05 to about 0.5.

In some embodiments, metal doped region 128Pd can extend a distance D1 of about 0.1 nm to about 2 nm into HK gate dielectric layer 128P from top surface of HK gate dielectric layer 128P. In some embodiments, bimetallic nitride layer 129 can have a thickness T1 of about 0.1 nm to about 1 nm, and thickness T1 can be smaller than distance D1. These ranges of distance D1 and thickness T1 are adequate for controlling the respective concentrations of metal dopants and the first metal. If distance D1 is less than about 0.1 nm, metal doped region 128Pd may not have the concentration ratio of metal dopant-to-HK metal within the range of about 0.05 to about 0.5 for adequately adjusting the EWF value of gate structure 112P. Similarly, if thickness T1 is less than about 0.1 nm, bimetallic nitride layer 129 may not have the concentration of the first metal within the range of about 2 atomic % to about 10 atomic % for adequately adjusting the EWF value of gate structure 112P. On the other hand, if distance D1 and/or thickness T1 is greater than the above mentioned ranges, the processing time (e.g., doping process time) increases, and consequently increases device manufacturing cost.

Referring to FIGS. 1D-1E, in some embodiments, the concentration profiles of the metal dopants in metal doped region 128Pd and the first metal in bimetallic nitride layer 129 can be substantially constant along line C-C of FIG. 1B. In some embodiments, the concentrations of the metal dopants and the first metal can be equal to each other, as shown in FIG. 1D or the concentration of the metal dopants can be greater than the concentration of the first metal, as shown in FIG. 1E. Referring to FIG. 1F, in some embodiments, the concentration profiles of the metal dopants and the first metal can be graded along line C-C of FIG. 1B and the concentration of the metal dopants can be greater than the concentration of the first metal.

Referring to FIG. 1G, in some embodiments, IO layer 127 includes silicon oxide ($SiO_2$), HK gate dielectric layer 128P includes hafnium oxide ($HfO_2$) with Al dopants in metal doped region 128Pd, bimetallic nitride layer 129 includes titanium aluminum nitride (TiAlN), and pWFM layer 130 includes TiN. FIG. 1G illustrates the concentration profiles of silicon, oxygen, hafnium, aluminum, titanium, and nitrogen atoms across these layers along line C-C of FIG. 1B, according some embodiments. As illustrated in FIG. 1G, the aluminum concentration can be higher in metal doped region 128Pd than that in bimetallic nitride layer 129.

Referring back to FIGS. 1B-1C, in some embodiments, nWFM layers 131 can include titanium aluminum (TiAl), titanium aluminum carbide (TiAlC), tantalum aluminum (TaAl), tantalum aluminum carbide (TaAlC), or a combination thereof. Glue layers 132 can include TiN, Ti, Co, or a combination thereof. Gate metal fill layers 133 can include a suitable conductive material, such as W, Ti, silver (Ag), ruthenium (Ru), molybdenum (Mo), copper (Cu), cobalt (Co), Al, iridium (Ir), nickel (Ni), metal alloys, and a combination thereof. Gate spacers 114 and inner spacers 113 can form sidewalls of gate structures 112P-112N. Each of gate spacers 114 and inner spacer 113 can include insulating material, such as silicon oxide, silicon nitride, silicon oxynitride, a low-k material, and a combination thereof.

Semiconductor device 100 can further include isolation structure 104, etch stop layer (ESL) 116, interlayer dielectric (ILD) layer 118, and shallow trench isolation (STI) regions 138. Isolation structure 104 can electrically isolate PFETs 102P1-102P4 and NFETs 102N1-102N4 from each other. ESL 116 can be configured to protect gate structures 112P-112N and/or S/D regions 110P-110N. In some embodiments, isolation structure 104 and ESL 116 can include an insulating material, such as silicon oxide and silicon germanium oxide. ILD layer 118 can be disposed on ESL 116 and can include a dielectric material. STI regions 138 can be configured to provide electrical isolation between PFETs 102P1-102P4 and NFETs 102N1-102N4 and can include an insulating material.

FIG. 2 is a flow diagram of an example method 200 for fabricating semiconductor device 100, according to some embodiments. For illustrative purposes, the operations illustrated in FIG. 2 will be described with reference to the example fabrication process for fabricating semiconductor device 100 as illustrated in FIGS. 3A-11B. FIGS. 3A-11B are cross-sectional views along lines A-A and B-B of semiconductor device 100 at various stages of fabrication, according to some embodiments. Operations can be performed in a different order or not performed depending on specific applications. It should be noted that method 200 may not produce a complete semiconductor device 100. Accordingly, it is understood that additional processes can be provided before, during, and after method 200, and that some other processes may only be briefly described herein. Elements in FIGS. 3A-11B with the same annotations as elements in FIGS. 1A-1C are described above.

In operation 205, polysilicon structures and epitaxial regions are formed on fin structures of a PFET and NFET. For example, as shown in FIGS. 3A-3B, polysilicon structures 312 can be formed on superlattice structures 119P-119N, which are formed on fin structures 108P-108N. Superlattice structure 119P can include nanostructured regions 120P-122P arranged in an alternating configuration and superlattice structure 119N can include nanostructures regions 120N-122N arranged in an alternating configuration. During subsequent processing, polysilicon structures 312 and nanostructured regions 122P-122N can be replaced in a gate replacement process to form gate structures 112P-112N. Following the formation of inner spacers 113 and gate spacers 114, epitaxial regions 110P-110N can be selectively formed on portions of fin structures 108P-108N that are not underlying polysilicon structures 312. After the formation of epitaxial regions 110P-110N, ESL 116 and ILD 118 can be formed to form the structures of FIGS. 3A-3B.

Referring to FIG. 2, in operation 210, gate openings are formed on the fin structures. For example, as shown in FIGS. 4A-4B, gate openings 412A-412B can be formed on fin structures 108P-108N. The formation of gate openings 412A-412B can include sequential operations of (i) etching polysilicon structures 312 from the structures of FIGS. 3A-3B, and (ii) etching nanostructured regions 122P-122N from the structures of FIGS. 3A-3B.

Referring to FIG. 2, in operations 215-235, gate-all-around (GAA) structures are formed in the gate openings. For example, based on operations 215-235, gate structures 112P-112N can be formed surrounding nanostructured channel regions 120P-120N, as described with reference to FIGS. 5A-11B.

Figures 5A, 5B:
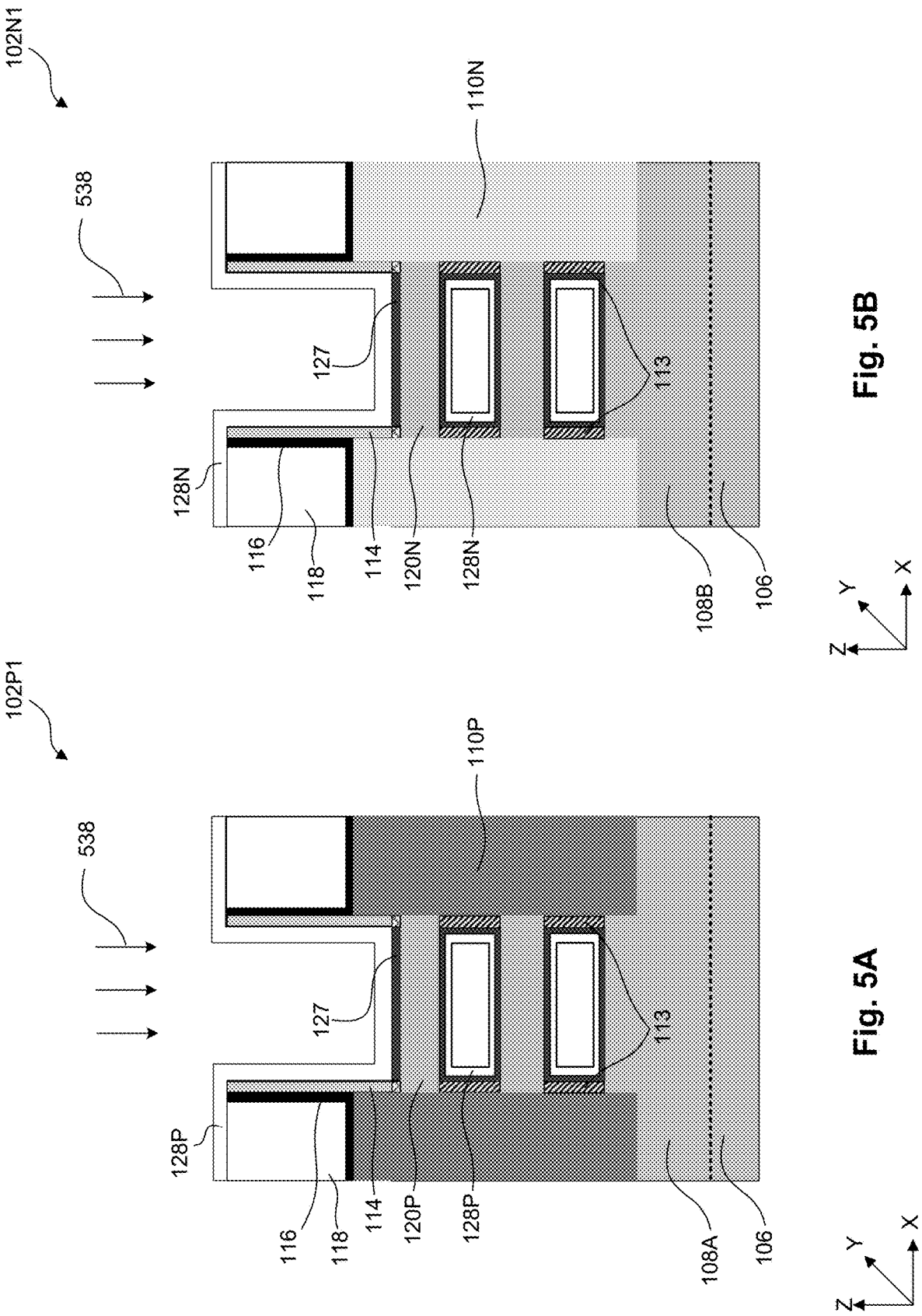

Referring to FIG. 2, in operation 215, interfacial oxide layers and an HK gate dielectric layer are deposited within the gate openings. For example, as shown in FIGS. 5A-5B, IO layers 127 and an HK gate dielectric layer 128 can be deposited within gate openings 412A-412B of FIGS. 4A-4B. During subsequent processing, HK gate dielectric layer 128 can form HK gate dielectric layers 128P-128N of FIGS. 1B-1C. In some embodiments, IO layers 127 can be formed by exposing nanostructured channel regions 120P-120N to an oxidizing ambient. The oxidizing ambient can include a combination of ozone ($O_3$), a mixture of ammonia hydroxide, hydrogen peroxide, and water ("SC1 solution"), and/or a mixture of hydrochloric acid, hydrogen peroxide, water ("SC2 solution"). The deposition of HK gate dielectric layer 128 can include depositing an HK dielectric material in an atomic layer deposition (ALD) process using hafnium chloride ($HfCl_4$) as a precursor at a temperature of about 250° C. to about 350° C. In some embodiments, gate dielectric layer 128 can have a thickness of about 1 nm to about 3 nm to wrap around nanostructures channel regions 120P-120N without being constrained by the spacings between adjacent nanostructured channel regions 120P and between adjacent nanostructured channel regions 120N.

Referring to FIG. 2, in operation 220, metal doped regions are formed within the HK gate dielectric layer. For example, as shown in FIGS. 7A-7B, metal doped regions 128Pd-128Nd can be formed within HK gate dielectric layer 128. The formation of metal doped regions 128Pd-128Nd can include sequential operations of (i) soaking the structures of FIGS. 5A-5B with a metal precursor gas 538, and (ii) soaking the structures of FIGS. 6A-6B with a metal precursor gas 642. In some embodiments, the soaking process with metal precursor gas 538 can include flowing titanium tetrachloride ($TiCl_4$) as metal precursor gas 538 on the structures of FIGS. 5A-5B at a temperature of about 350° C. to about 500° C. and a pressure of about 500 standard cubic cm (sccm) to about 9000 sccm for a duration of about 0.1 seconds to about 5 seconds. During the treatment with metal precursor gas 538, a metal layer 640 having Ti and a thickness of about 0.1 nm to about 0.5 nm can be deposited on the structures of FIGS. 5A-5B, as shown in FIGS. 6A-6B.

Figures 6A, 6B:
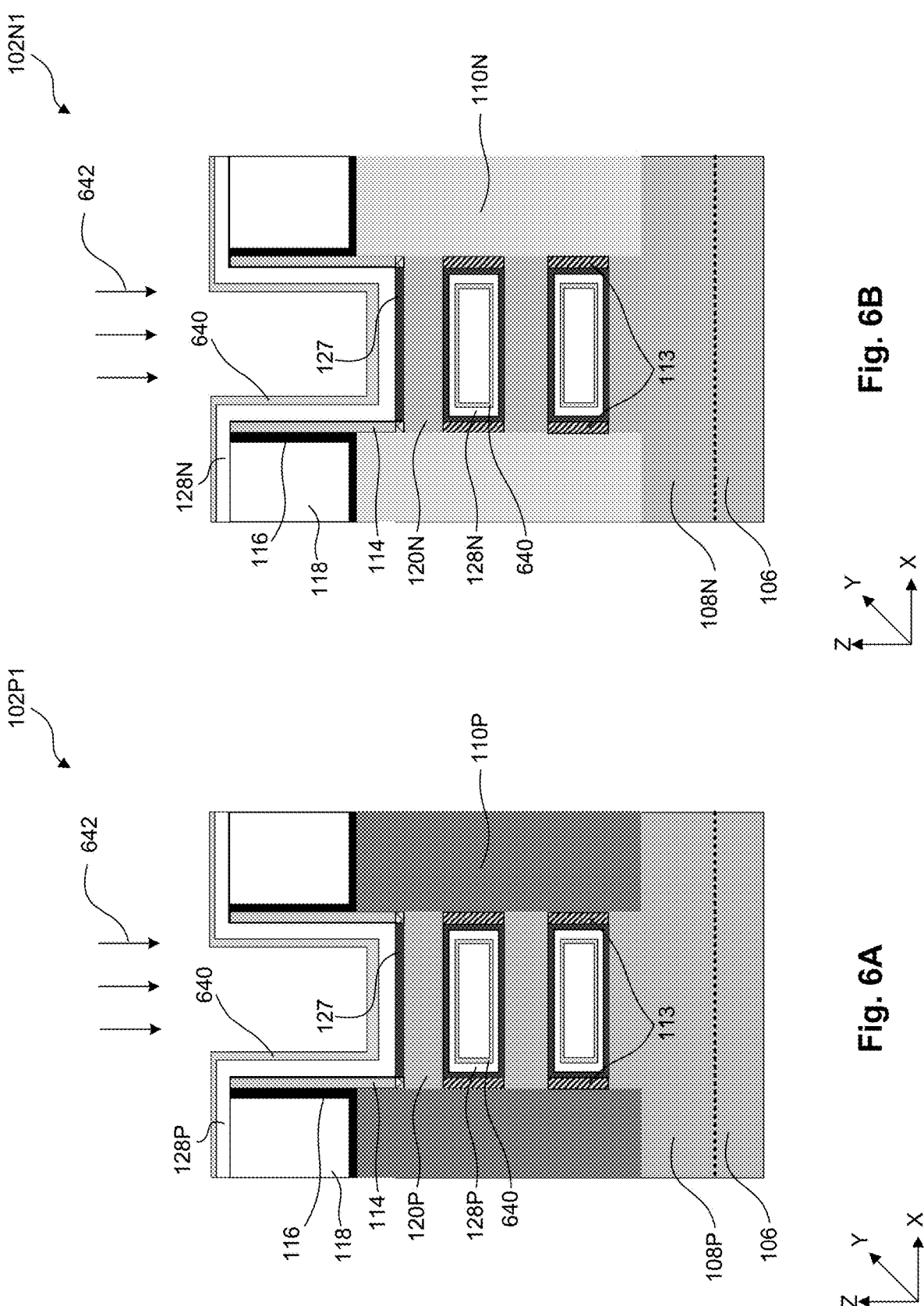
Figures 7A, 7B:
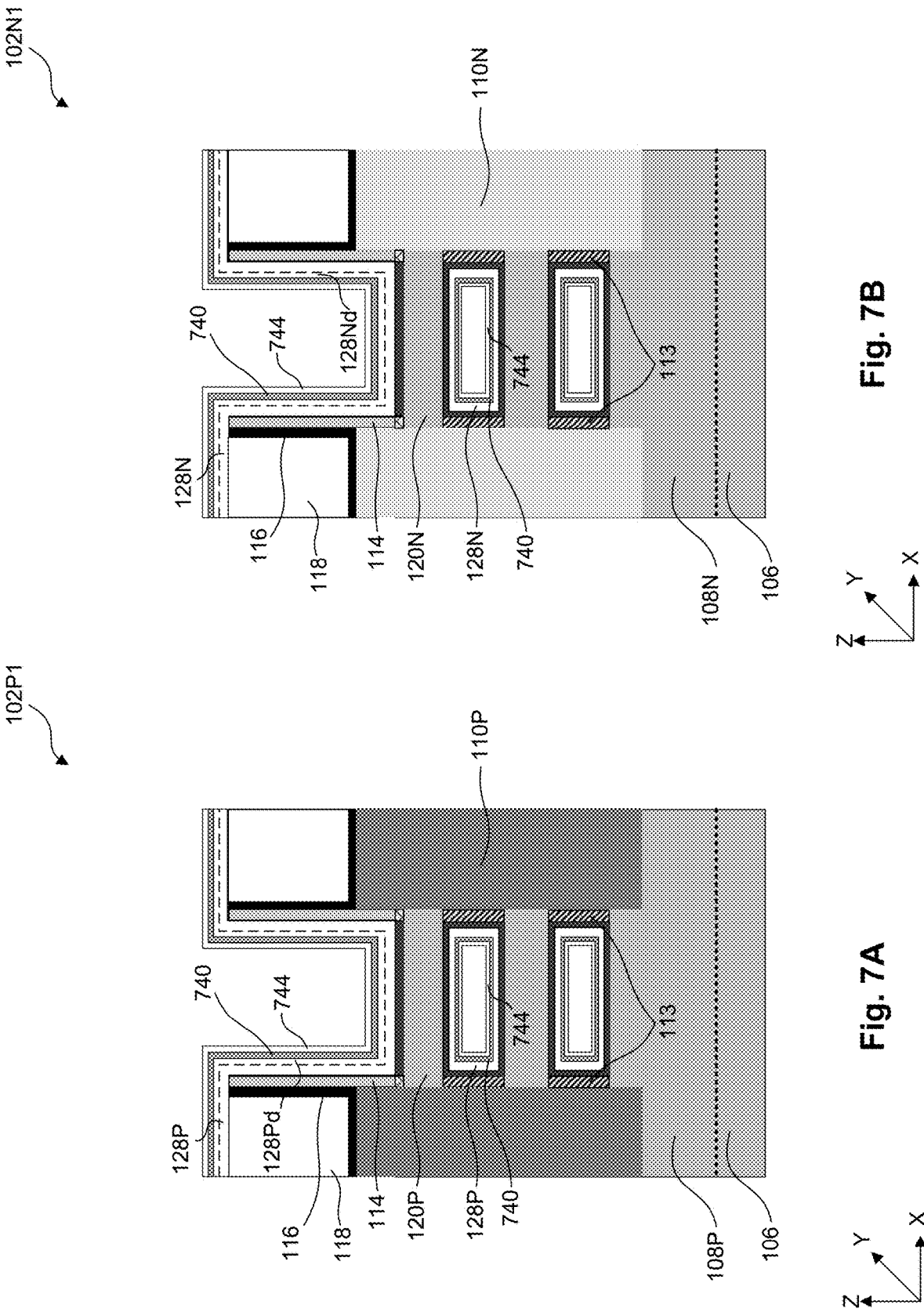

In some embodiments, the soaking process with metal precursor gas 642 can include flowing Tricthylaluminium (TEA) or Trimethylaluminum (TMA) as metal precursor gas 642 on the structures of FIGS. 6A-6B at a temperature of about 350° C. to about 500° C. and a pressure of about 2000 sccm to about 9000 sccm for a duration of about 0.5 seconds to about 60 seconds. During the treatment with metal precursor gas 642, (i) metal doped regions 128Pd-128Nd can be formed within HK gate dielectric layer 128, (ii) metal layer 640 can be converted to a metal layer 740 having TiAl, and (iii) a metal layer 744 having Al and a thickness of about 0.1 nm to about 0.5 nm can be deposited on metal layer 740, as shown in FIGS. 7A-7B.

Figures 8A, 8B:
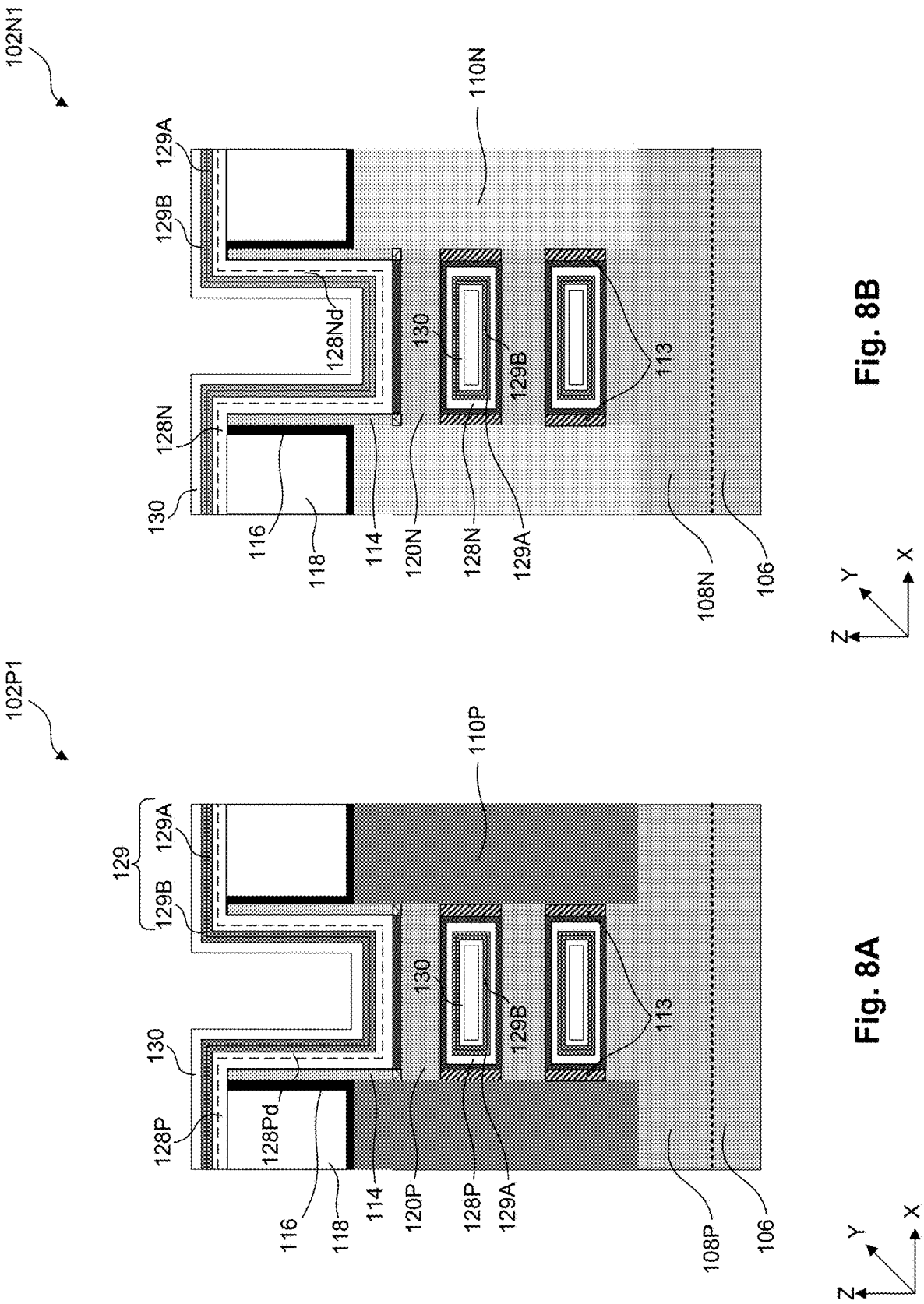

Referring to FIG. 2, in operation 225, a bimetallic nitride layer and a pWFM layer are formed on the HK gate dielectric layer. For example, as shown in FIGS. 8A-8B, bimetallic nitride layer 129 and pWFM layer 130 can be formed on HK gate dielectric layer 128. In some embodiments, the formation of pWFM layer 130 can include depositing a layer of TiN with a thickness of about 1 nm to about 3 nm in an ALD process using $TiCl_4$ and ammonia ($NH_3$) as precursors at a temperature of about 350° C. to about 475° C. In some embodiments, the ALD process for depositing TiN layer can include about 30 cycles to about 90 cycles, where one cycle can include sequential periods of: (i) $TiCl_4$ gas flow, (ii) $TiCl_4$ gas purging process, (iii) $NH_3$ gas flow, and (iv) $NH_3$ gas purging process.

In some embodiments, the ALD process $TiCl_4$ gas can react with TiAl of metal layer 740 to convert to TiAlN of bimetallic nitride layer 129A, and the ALD process $NH_3$ gas can react with Al of metal layer 744 to convert to TiAlN of bimetallic nitride layer 129B. As a result, during the ALD process for forming pWFM layer 130, bimetallic nitride layer 129 can be formed by converting metal layers 740 and 744 to respective bimetallic nitride layers 129A and 129B, as shown in FIGS. 8A-8B. The operations 220-225 can be performed in-situ to oxidation of metal layers 740 and 744.

Figures 9A, 9B:
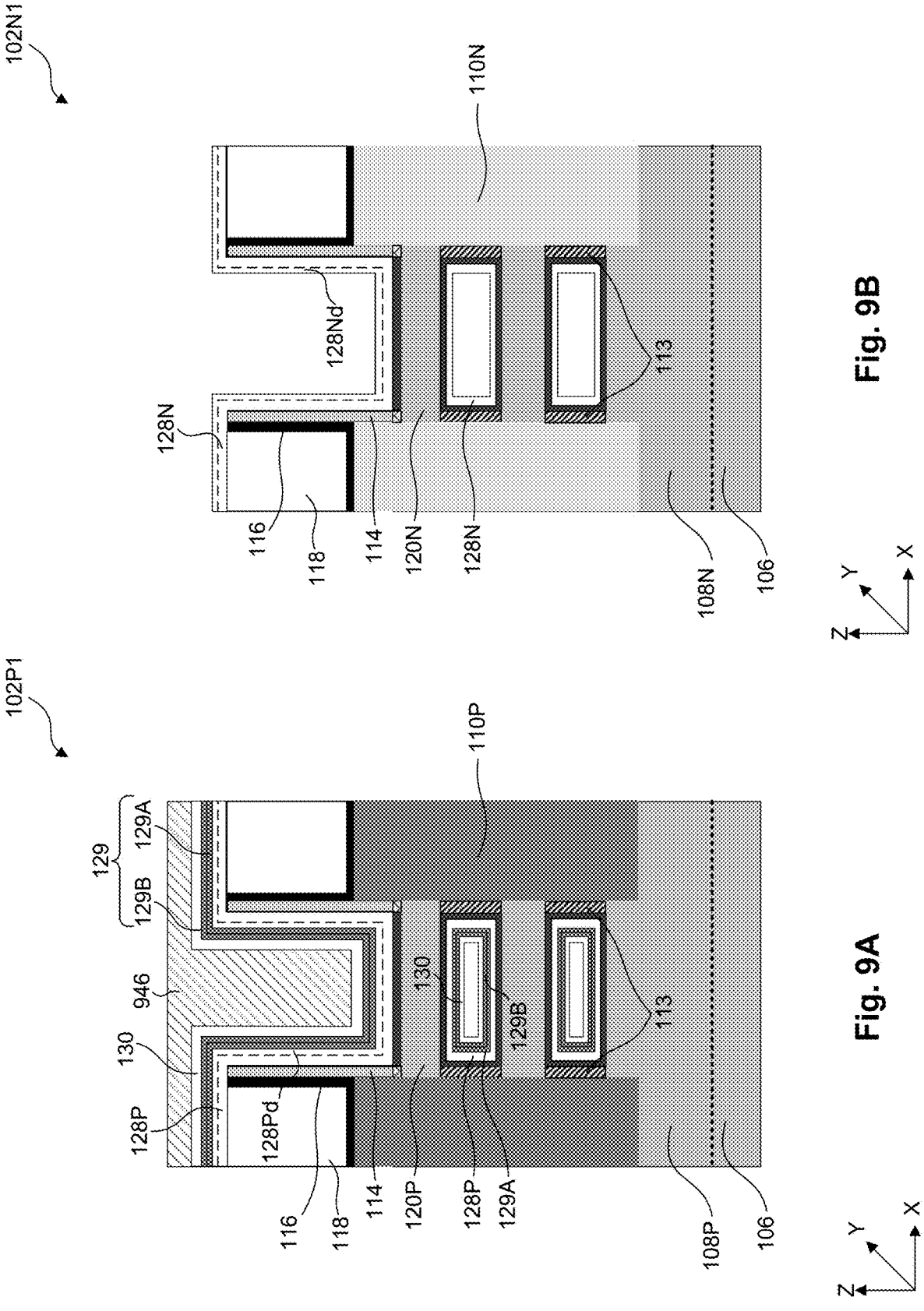

Referring to FIG. 2, in operation 230, portions of bimetallic nitride layer and pWFM layer are selectively removed from the NFET. For example, as shown in FIGS. 9A-9B, portions of bimetallic nitride layer 129 and pWFM layer 130 can be removed from NFET 102N1. The selective removal process can include sequential operations of (i) patterning a masking layer 946 (e.g., a photoresist layer) on portions of bimetallic nitride layer 129 and pWFM layer 130 on PFET 102P1, as shown in FIGS. 9A-9B, (ii) etching portion of pWFM layer 130 from NFET 102N1, and (iii) etching portion bimetallic layer 129 from NFET 102N1 to form the structure of FIG. 9B. In some embodiments, operation 230 can be an ex-situ operation.

Figures 10A, 10B:
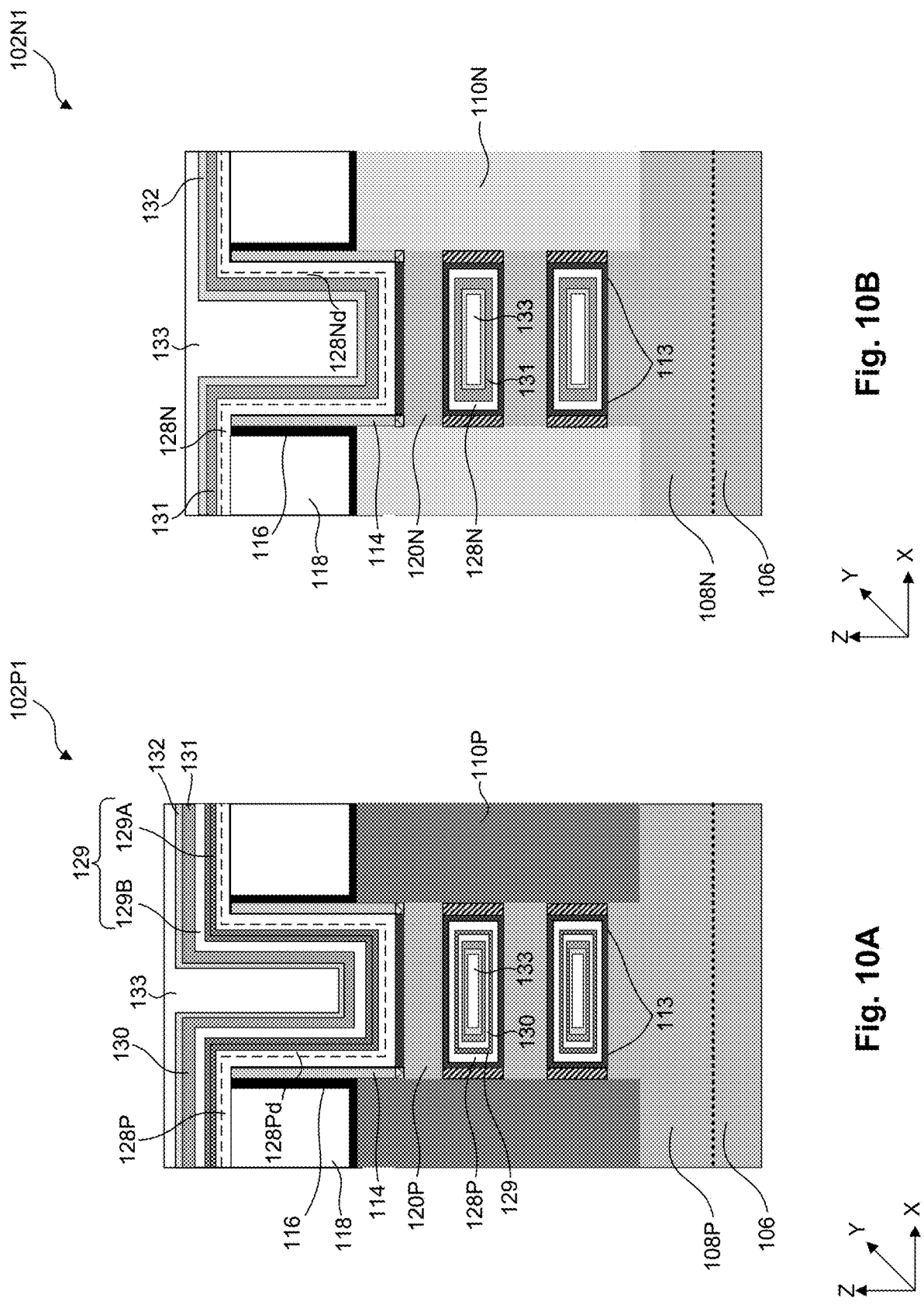
Figures 11A, 11B:
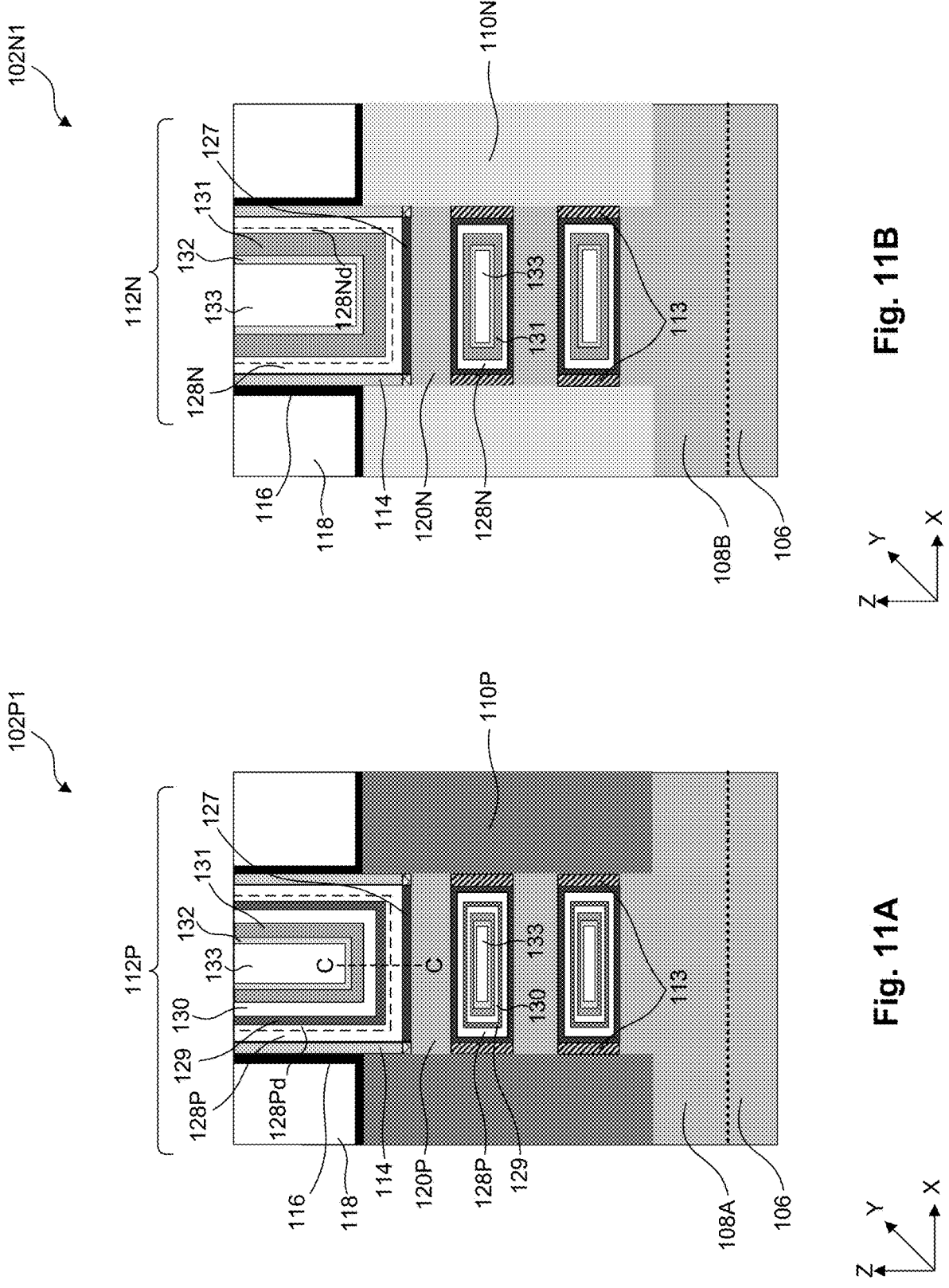

Referring to FIG. 2, in operation 235, nWFM layers, glue layers, and gate metal fill layers are formed on the pWFM layer of the PFET and on the HK dielectric layer of the NFET. For example, as shown in FIGS. 10A-11B, nWFM layers 131, glue layers 132, and gate metal fill layers 133 can be formed. In some embodiments, the formation of nWFM layer 131 can include depositing a layer of TiAl with a thickness of about 1 nm to about 3 nm in an ALD process using $TiCl_4$ and TEA or TMA as precursors at a temperature of about 350° C. to about 475° C. In some embodiments, the ALD process for depositing TiAl layer can include about 4 cycles to about 12 cycles, where one cycle can include sequential periods of: (i) $TiCl_4$ gas flow, (ii) $TiCl_4$ gas purging process, (iii) TEA or TMA gas flow, and (iv) TEA or TMA gas purging process. Following the formation of nWFM layer 130, glue layer 132 and gate metal fill layer 133 can be deposited, as shown in FIGS. 10A-10B, which can be followed by a chemical mechanical polishing process to form the structures of FIGS. 11A-11B.

FIG. 12 is a flow diagram of an example method 200 for fabricating semiconductor device 100, according to some embodiments. For illustrative purposes, the operations illustrated in FIG. 12 will be described with reference to the example fabrication process for fabricating semiconductor device 100 as illustrated in FIGS. 13A-17B. FIGS. 13A-17B are cross-sectional views along lines A-A and B-B of semiconductor device 100 at various stages of fabrication, according to some embodiments. Operations can be performed in a different order or not performed depending on specific applications. It should be noted that method 200 may not produce a complete semiconductor device 100. Accordingly, it is understood that additional processes can be provided before, during, and after method 200, and that some other processes may only be briefly described herein. Elements in FIGS. 13A-17B with the same annotations as elements in FIGS. 1A-1C are described above.

Referring to FIG. 12, similar to operations 205-215, operations 1205-1215 can be performed to form structures similar to that of FIGS. 5A-5B.

Figures 13A, 13B:
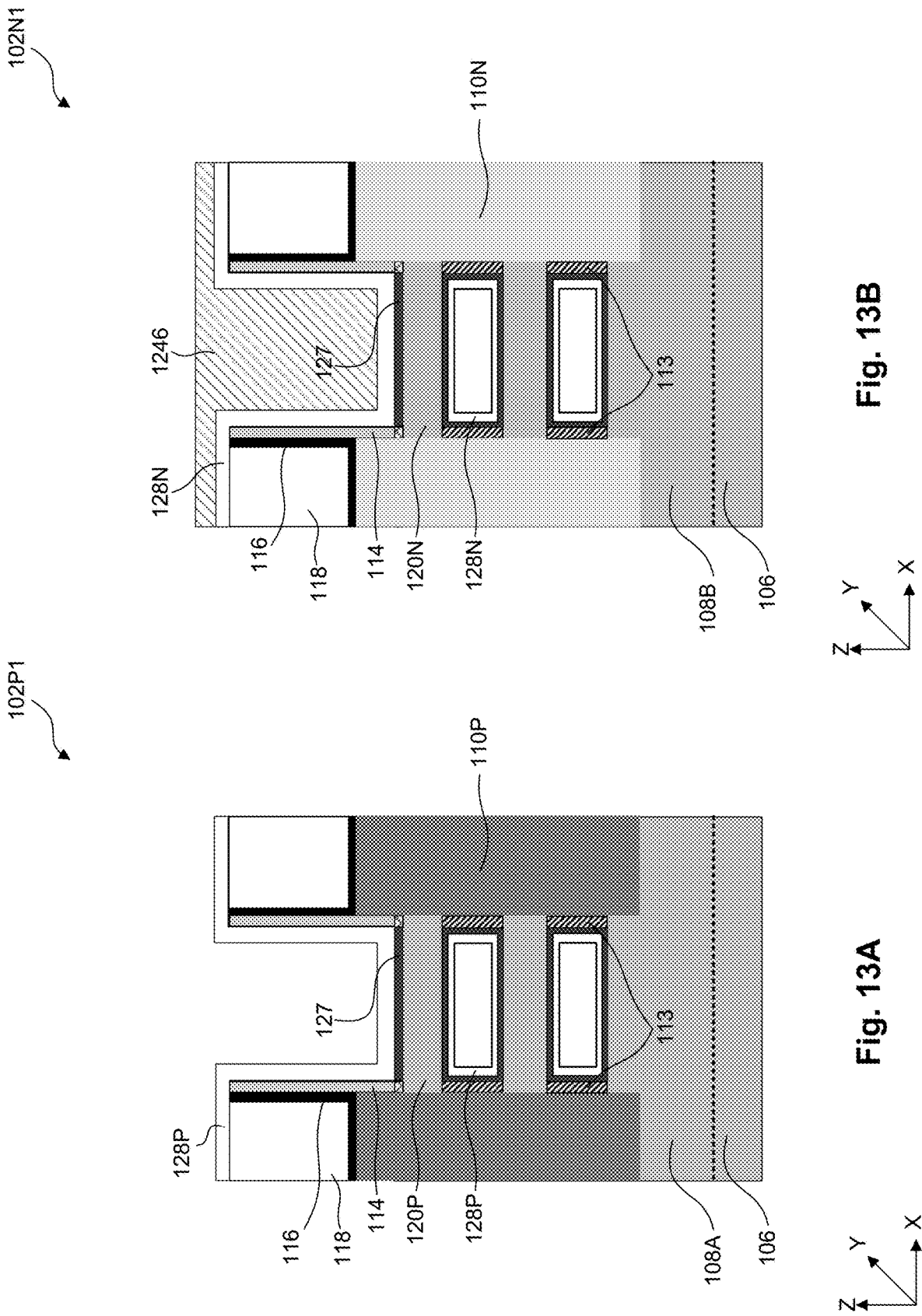
Figures 14A, 14B:
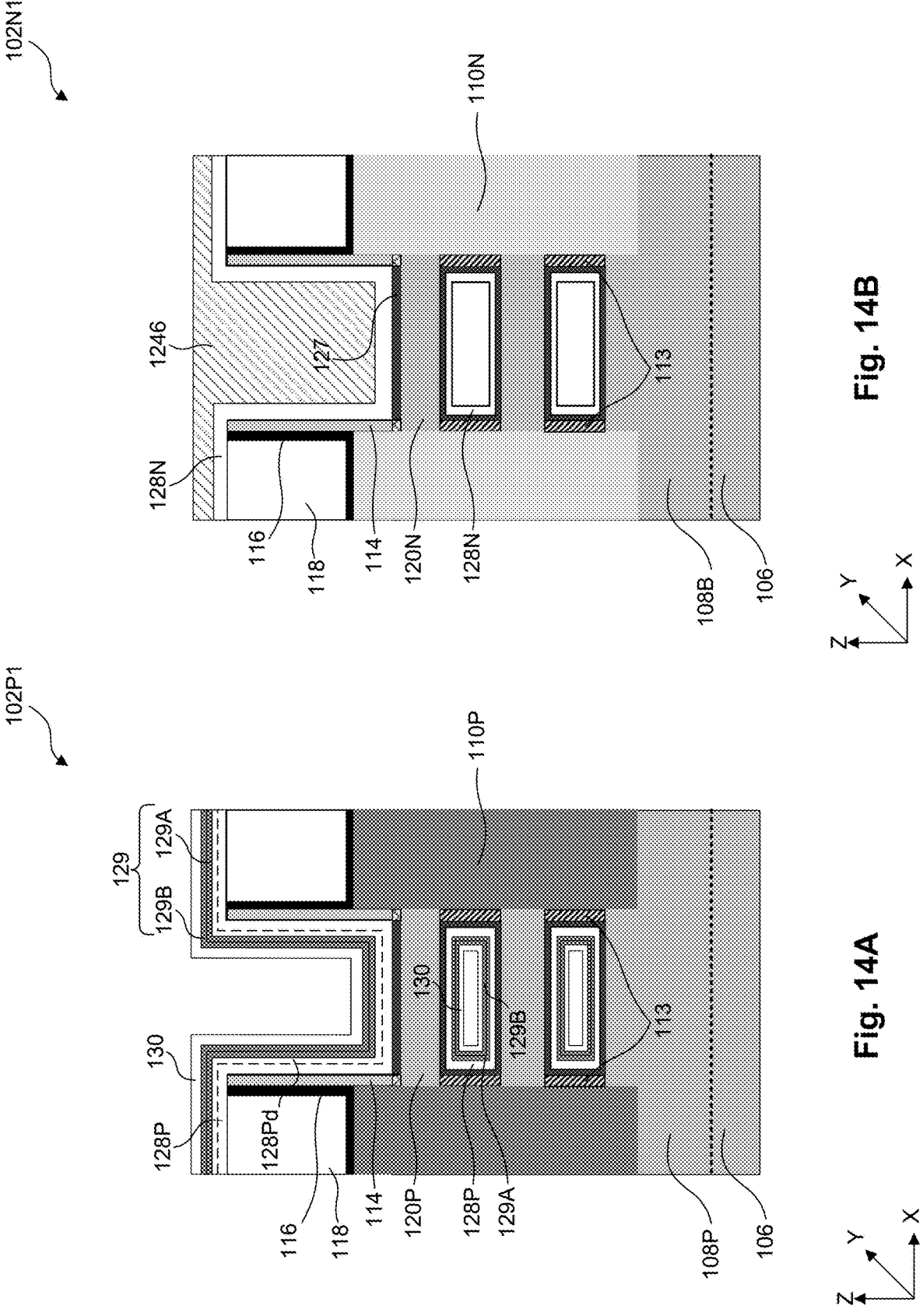
Figures 15A, 15B:
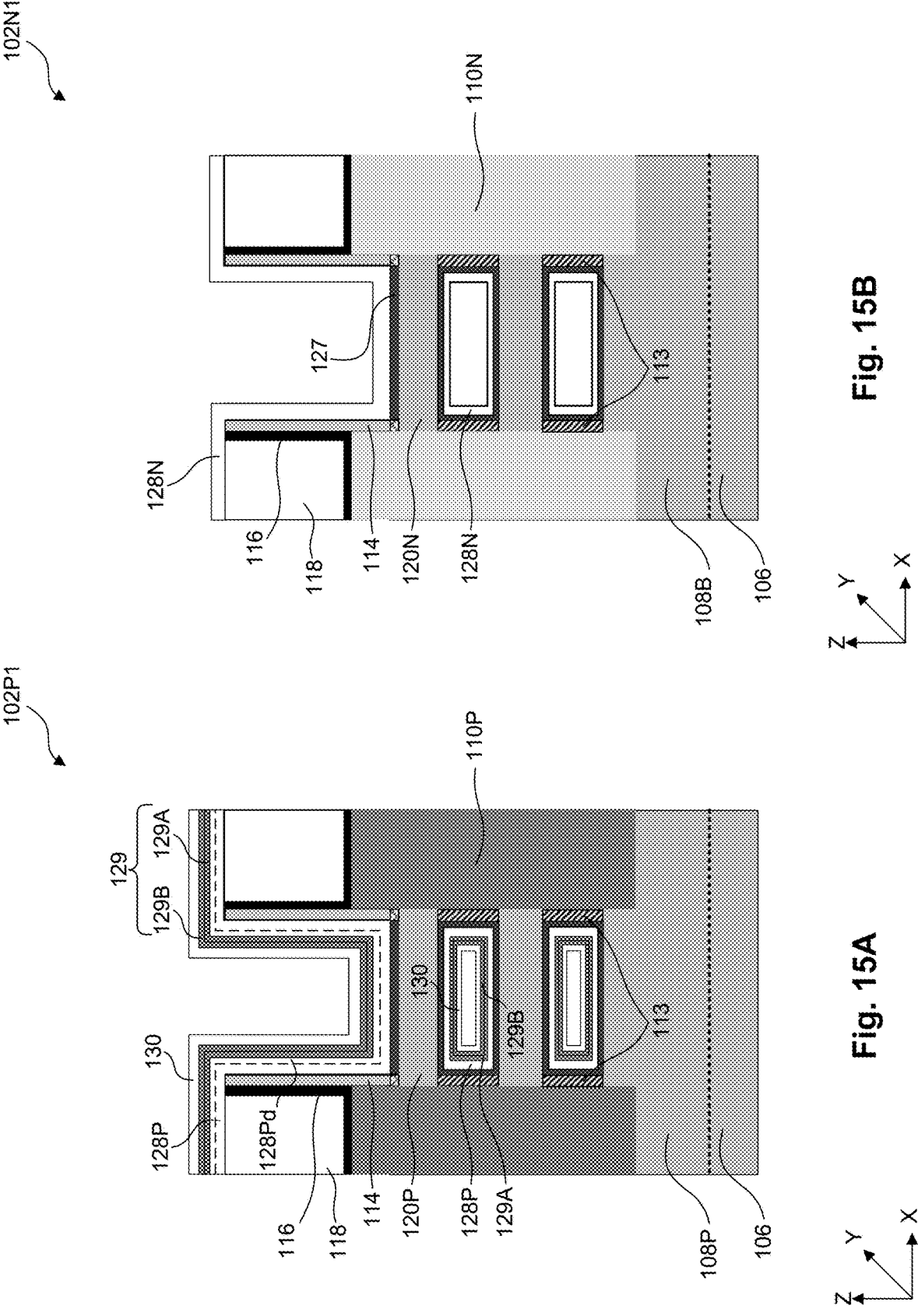
Figures 16A, 16B:
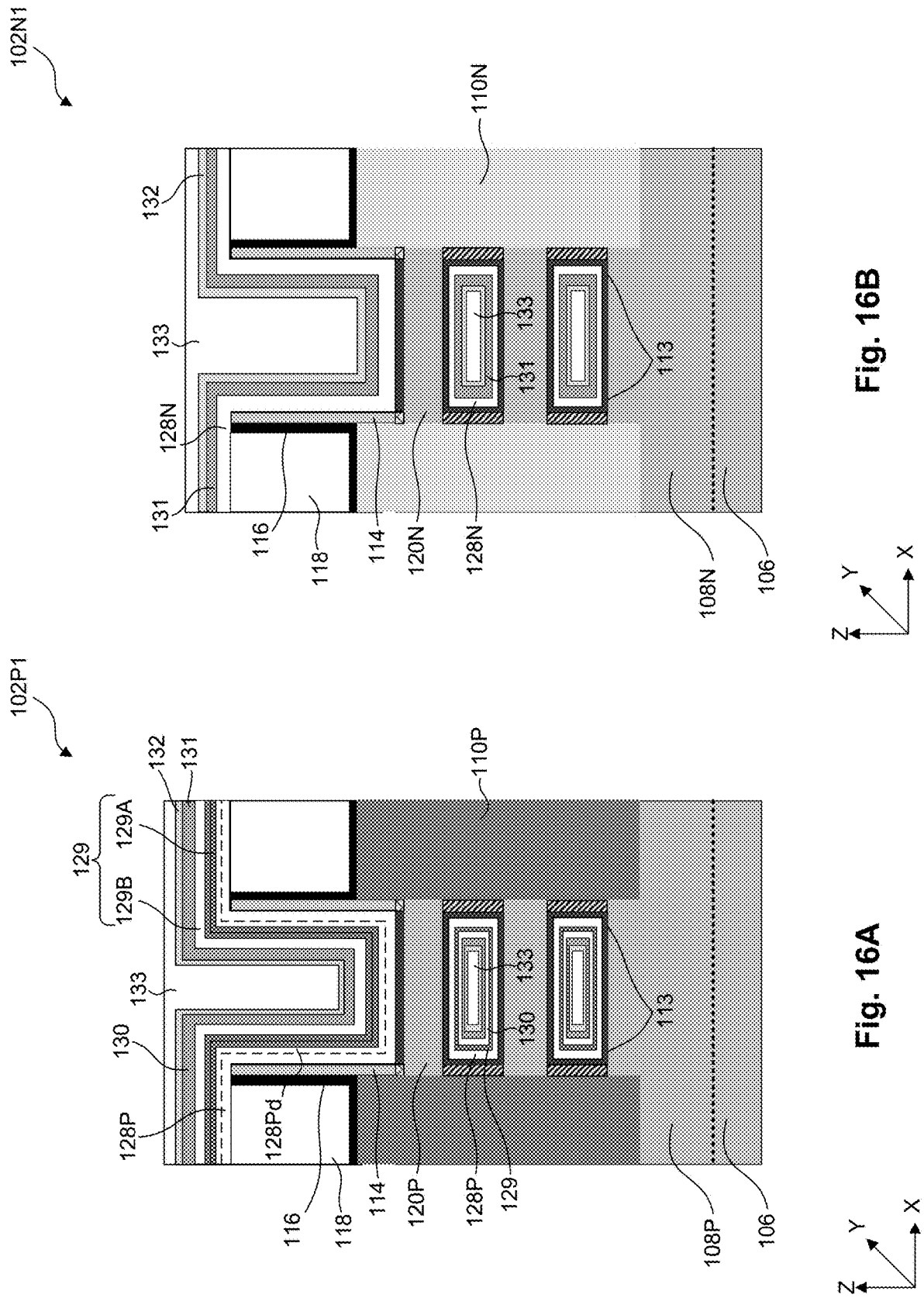

Referring to FIG. 12, in operation 1220, a metal doped region is selectively formed within a portion of the HK gate dielectric layer of the PFET and a bimetallic nitride layer and a pWFM layer are selectively formed on the portion of the HK gate dielectric layer. For example, as shown in FIGS. 13A-14B, metal doped region 128Pd can be selectively formed within the portion of HK gate dielectric layer 128 of PFET 102P1 ("HK PFET portion"), and bimetallic nitride layer 129 and pWFM layer 130 can be selectively formed on the HK PFET portion. This selective formation process can include sequential operations of (i) patterning a masking layer 1246 (e.g., a photoresist layer) on a portion of HK gate dielectric layer 128 of NFET 102N1, as shown in FIGS. 13A-13B, (ii) forming metal doped region 128Pd within the HK PFET portion, and (iii) forming bimetallic nitride layer 129 and pWFM layer 130 on the HK PFET portion. The process for forming metal doped region 128Pd can be similar to that described in operation 220 of FIG. 2 and the process for forming bimetallic nitride layer 129 and pWFM layer 130 can be similar to that described in operation 225 of FIG. 2.

Referring to FIG. 12, in operation 1225, nWFM layers, glue layers, and gate metal fill layers are formed on the pWFM layer of the PFET and on the HK dielectric layer of the NFET. For example, as shown in FIGS. 15A-17B, nWFM layers 131, glue layers 132, and gate metal fill layers 133 can be formed. Prior to the formation of nWFM layers 131, glue layers 132, and gate metal fill layers 133, masking layer 1246 is removed from the structure of FIG. 14B to form the structure of FIG. 15B. Following the removal of masking layer 1246, nWFM layers 131, glue layers 132, and gate metal fill layers 133 can be formed in a process similar to that described in operation 235 of FIG. 2 to form the structures of FIGS. 16A-16B, which can be followed by a chemical mechanical polishing process to form the structures of FIGS. 17A-17B.

The present disclosure provides example multi-Vt devices with FETs (e.g., PFETs 102P1-102P4 and NFETs 102N1-102N4) having threshold voltages different from each other and provides example methods of forming such FETs on the same substrate (e.g., substrate 106). The example methods form PFETs with WFM layer (e.g., pWFM layer 130) of similar material and thickness, but with different threshold voltages on the same substrate. In some embodiments, PFETs with different gate structure configurations, but with similar WFM layer can be selectively formed on the same substrate to achieve threshold voltages different from each other. The different gate structures can have (i) metal doped regions of different metal concentrations within high-K (HK) gate dielectric layers and (ii) bimetallic nitride layers of different metal concentrations between HK gate dielectric layers and WFM layers. The different metal concentrations result in gate structures with different EWF values and threshold voltages. In some embodiments, varying metal concentrations within a range of about 2 atomic % to about 10 atomic % can induce about ±80 mV shifts in EWF values and about ±50 mV shifts in threshold voltages. Thus, tuning the metal concentrations within HK gate dielectric layers and between HK gate dielectric layers and WFM layers can tune the EWF values of the PFET gate structures, and as a result can adjust the threshold voltages of the PFETs without varying the material and/or thickness of the WFM layers.

In some embodiments, a semiconductor device includes a substrate, a fin structure disposed on the substrate, a nano-structured channel region disposed on the fin structure, and a gate-all-around (GAA) structure surrounding the nano-structured channel region. The GAA structure includes a high-K (HK) gate dielectric layer with a metal doped region having dopants of a first metallic material, a p-type work function metal (pWFM) layer disposed on the HK gate dielectric layer, a bimetallic nitride layer interposed between the HK gate dielectric layer and the pWFM layer, an n-type work function metal (nWFM) layer disposed on the pWFM layer, and a gate metal fill layer disposed on the nWFM layer. The pWFM layer includes a second metallic material and the bimetallic nitride layer includes the first and second metallic materials.

In some embodiments, a semiconductor device includes a substrate, a p-type FET with a first gate structure disposed on the substrate, and an n-type FET with a second gate structure disposed on the substrate. The first and second gate structures includes high-K (HK) gate dielectric layers with metal doped regions having dopants of a first metal, n-type work function metal (nWFM) layers disposed on the HK gate dielectric layers, and gate metal fill layers disposed on the nWFM layers. The first gate structure includes a p-type work function metal (pWFM) layer and a bimetallic nitride layer interposed between the HK gate dielectric layer and the nWFM layer. The pWFM layer has a second metal and the bimetallic nitride layer having the first and second metals.

In some embodiments, a method includes forming a nanostructured channel region on a fin structure, forming a gate opening surrounding the nanostructured channel region, depositing a high-K (HK) gate dielectric layer within the gate opening, forming a metal doped region with dopants of a second metal within the HK gate dielectric layer, forming a bimetallic nitride layer on the HK gate dielectric layer, depositing a p-type work function metal (pWFM) layer on the bimetallic nitride layer, depositing an n-type work function metal (nWFM) layer on the pWFM layer, and depositing a gate metal fill layer on the nWFM layer. The HK gate dielectric layer includes a first metal and the second metal is different from the first metal. The pWFM layer includes a third metal different from the first and second metals and the bimetallic nitride layer includes the second and third metals.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a substrate;

a source/drain region disposed on the substrate; and a gate structure, disposed on the substrate, comprising:

a dielectric layer with a doped region having first metal atoms;

a conductive layer comprising second metal atoms disposed on the dielectric layer;

a nitride layer comprising the first and second metal atoms disposed between the dielectric layer and the conductive layer, wherein a thickness of the doped region is greater than a thickness of the nitride layer; and a gate metal fill layer disposed on the nitride layer.

2. The semiconductor device of claim 1, wherein a concentration profile of the first metal atoms across the dielectric layer and the nitride layer comprises a linear profile.

3. The semiconductor device of claim 1, wherein a concentration profile of the first metal atoms across the dielectric layer and the nitride layer comprises a slope decreasing from a bottom surface of the doped region to a top surface of the nitride layer.

4. The semiconductor device of claim 1, wherein a concentration profile of the first metal atoms across the dielectric layer and the nitride layer comprises a peak concentration in the dielectric layer.

5. The semiconductor device of claim 1, wherein concentration profiles of the first and second metal atoms across the nitride layer comprise slopes opposite to each other.

6. The semiconductor device of claim 1, wherein a concentration profile of the second metal atoms across the nitride layer comprises a slope increasing from a bottom surface of the nitride layer to a top surface of the nitride layer.

7. The semiconductor device of claim 1, wherein a concentration profile of the second metal atoms across the nitride layer and the conductive layer comprises a slope increasing from a bottom surface of the doped region to a top surface of the conductive layer.

8. The semiconductor device of claim 1, wherein a concentration profile of the second metal atoms across the nitride layer and the conductive layer comprises a peak concentration in the conductive layer.

9. The semiconductor device of claim 1, wherein the first metal atoms comprise aluminum atoms, and wherein the second metal atoms comprise titanium atoms.

10. The semiconductor device of claim 1, wherein the first metal atoms comprise rare-earth metal atoms.

11. A semiconductor device, comprising:

a substrate;

a first gate structure, disposed on the substrate, comprising:

a first dielectric layer with a first doped region having first metal atoms, and a nitride layer comprising the first metal atoms and second metal atoms disposed on the first dielectric layer, wherein a concentration of the first metal atoms is greater than a concentration of the second metal atoms in the nitride layer; and a second gate structure, disposed on the substrate, comprising:

a second dielectric layer with a second doped region having the first metal atoms; and a conductive layer comprising the first and second metal atoms disposed on the second dielectric layer.

12. The semiconductor device of claim 11, further comprising an aluminum-free conductive layer disposed on the nitride layer.

13. The semiconductor device of claim 11, wherein the first metal atoms comprise aluminum atoms, and wherein the second metal atoms comprise titanium atoms.

14. The semiconductor device of claim 11, wherein a concentration profile of the first metal atoms across the first dielectric layer and the nitride layer comprises a slope decreasing from a bottom surface of the first doped region to a top surface of the nitride layer.

15. The semiconductor device of claim 11, wherein a concentration profile of the first metal atoms across the first dielectric layer and the nitride layer comprises a peak concentration in the first dielectric layer.

16. The semiconductor device of claim 11, wherein concentration profiles of the first and second metal atoms across the nitride layer comprise slopes opposite to each other.

17. A method, comprising:

forming first and second gate openings on a substrate;

depositing a dielectric layer comprising first metal atoms in the first and second gate openings;

forming, in the dielectric layer, first and second doped regions comprising second metal atoms;

forming, on the dielectric layer, a nitride layer comprising the second metal atoms and third metal atoms;

removing a portion of the nitride layer from the second gate opening; and depositing a gate metal fill layer to fill the first and second gate openings.

18. The method of claim 17, wherein forming the nitride layer comprises depositing a metal layer comprising the third metal atoms.

19. The method of claim 17, wherein forming the nitride layer comprises exposing a metal layer comprising the second and third metal atoms to a nitrogen-based gas.

20. The method of claim 17, wherein forming the first and second doped regions comprise exposing the dielectric layer to an aluminum precursor gas.

* * * * *